(12) United States Patent
Pickrell et al.

(10) Patent No.: US 12,218,497 B1
(45) Date of Patent: Feb. 4, 2025

(54) OPTICALLY SWITCHED CIRCUIT BREAKER WITH CASCADED TRANSISTOR TOPOLOGY

(71) Applicant: National Technology & Engineering Solutions of Sandia, LLC, Albuquerque, NM (US)

(72) Inventors: Gregory Pickrell, Rio Rancho, NM (US); Jason Christopher Neely, Albuquerque, NM (US); Lee Gill, Albuquerque, NM (US); Jacob Mueller, Albuquerque, NM (US); Luciano Andres Garcia Rodriguez, Albuquerque, NM (US); Jack David Flicker, Albuquerque, NM (US); Emily Ann Schrock, Albuquerque, NM (US); Robert Kaplar, Albuquerque, NM (US); Harold P. Hjalmarson, Albuquerque, NM (US); Jane Lehr, Placitas, NM (US)

(73) Assignees: National Technology & Engineering Solutions of Sandia, LLC, Albuquerque, NM (US); UNM Rainforest Innovations, Albuquerque, NM (US)

( * ) Notice: Subject to any disclaimer, the term of this patent is extended or adjusted under 35 U.S.C. 154(b) by 331 days.

(21) Appl. No.: 17/964,772

(22) Filed: Oct. 12, 2022

Related U.S. Application Data

(63) Continuation-in-part of application No. 17/737,593, filed on May 5, 2022, now Pat. No. 11,728,804.

(51) Int. Cl.
*H03K 5/08* (2006.01)
*H02H 1/00* (2006.01)
(Continued)

(52) U.S. Cl.
CPC ............ *H02H 9/02* (2013.01); *H02H 1/0007* (2013.01)

(58) Field of Classification Search
None
See application file for complete search history.

(56) References Cited

U.S. PATENT DOCUMENTS

| | | | |
|---|---|---|---|
| 5,804,815 A | 9/1998 | Loubriel et al. | |
| 8,912,840 B2 * | 12/2014 | Aggeler | H03K 17/102 327/430 |

(Continued)

OTHER PUBLICATIONS

Garcia Rodriguez, L. Gill, J. Mueller and J. Neely, "A High-Voltage Cascaded Solid-State DC Circuit Breaker Using Normally-ON SiC JFETs," 2021 IEEE 12th Energy Conversion Congress & Exposition—Asia (ECCE-Asia), 2021, pp. 1554-1561, doi: 10.1109/ECCE-Asia49820.2021.9479388 (Date of Conference: May 24-27, 2021).

(Continued)

*Primary Examiner* — Kenneth B Wells
(74) *Attorney, Agent, or Firm* — Mark A. Dodd

(57) ABSTRACT

A disclosed switching apparatus, such as a circuit breaker, includes a transistor switch circuit connected between a power input terminal and a load terminal, and, connected to the power input terminal and bypassing the transistor switch circuit, a switchable bypass leg that is optically switched by a series-connected photoconductive semiconductor switch (PCSS). The transistor switch circuit includes at least one cascade of three or more series-connected transistors, and at least one resistor network configured to divide a voltage from a voltage source across a cascade of series-connected transistors. Operating the switch apparatus includes detecting whether a sensed electric current is in a fault condition, opening the transistor switch circuit upon detecting a fault condition, and then closing the PCSS so that the electric current is diverted onto a switchable bypass path. The (Continued)

opening of the transistor switch circuit comprises turning OFF a normally-ON transistor switch circuit.

20 Claims, 20 Drawing Sheets

(51) Int. Cl.

| | |
|---|---|
| *H02H 9/02* | (2006.01) |
| *H02M 1/088* | (2006.01) |
| *H02M 1/34* | (2007.01) |
| *H03K 17/10* | (2006.01) |
| *H03K 17/16* | (2006.01) |
| *H03K 17/687* | (2006.01) |
| *H03K 17/693* | (2006.01) |

(56) References Cited

U.S. PATENT DOCUMENTS

| | | | |
|---|---|---|---|
| 2011/0291738 A1* | 12/2011 | Biela | H03K 17/102 |
| | | | 327/430 |
| 2020/0382118 A1 | 12/2020 | Voss et al. | |
| 2022/0231684 A1* | 7/2022 | Mehrotra | H03K 17/162 |

OTHER PUBLICATIONS

L. Gill, L. A. G. Rodriguez, J. Mueller and J. Neely, "A Comparative Study of SiC JFET Super-Cascode Topologies," 2021 IEEE Energy Conversion Congress and Exposition (ECCE), 2021, pp. 1741-1748, doi: 10.1109/ECCE47101.2021.9595065 (Date of Conference: Oct. 10-14, 2021).

P. Friedrichs, H. Mitlehner, R. Schorner, K.-. Dohnke, R. Elpelt and D. Stephani, "Stacked high voltage switch based on SiC VJFETs", ISPSD '03. 2003 IEEE 15th International Symposium on Power Semiconductor Devices and ICs 2003. Proceedings, pp. 139-142, 2003.

J. Biela, D. Aggeler, D. Bortis and J. W. Kolar, "Balancing Circuit for a 5-kV/50-ns Pulsed-Power Switch Based on SiC-JFET Super Cascode", IEEE Transactions on Plasma Science, vol. 40, No. 10, pp. 2554-2560, Oct. 2012.

J. Biela, D. Aggeler, D. Bortis and J. W. Kolar, "5kV/200ns Pulsed Power Switch based on a SiC-JFET Super Cascode", 2008 IEEE International Power Modulators and High-Voltage Conference, pp. 358-361, 2008.

D. Aggeler, F. Canales, J. Biela and J. W. Kolar, "Dv/ Dt-Control Methods for the SiC JFET/Si MOSFET Cascode", IEEE Transactions on Power Electronics, vol. 28, No. 8, pp. 4074-4082, Aug. 2013.

D. Aggeler, J. Biela and J. W. Kolar, "A compact high voltage 25 kW 50 kHz DC-DC converter based on SiC JFETs", 2008 Twenty-Third Annual IEEE Applied Power Electronics Conference and Exposition, pp. 801-807, 2008.

D. Aggeler, J. Biela and J. W. Kolar, "Controllable dv/dt behaviour of the SiC MOSFET/JFET cascode an alternative hard commutated switch for telecom applications", 2010 Twenty-Fifth Annual IEEE Applied Power Electronics Conference and Exposition (APEC), pp. 1584-1590, 2010.

Gao, A. J. Morgan, Y. Xu, X. Zhao and D. C. Hopkins, "6.0KV 100A 175kHz super cascode power module for medium voltage high power applications", 2018 IEEE Applied Power Electronics Conference and Exposition (APEC), pp. 1288-1293, 2018.

Gao, A. Morgan, Y. Xu, X. Zhao, B. Ballard and D. C. Hopkins, "6.5kV SiC JFET-based Super Cascode Power Module with High Avalanche Energy Handling Capability", 2018 IEEE 6th Workshop on Wide Bandgap Power Devices and Applications (WiPDA), pp. 319-322, 2018.

X. Ni, R. Gao, X. Song, A. Q. Huang and W. Yu, "Development of 6kV SiC hybrid power switch based on 1200V SiC JFET and MOSFET", 2015 IEEE Energy Conversion Congress and Exposition (ECCE), pp. 4113-4118, 2015.

X. Song, A. Q. Huang, S. Sen, L. Zhang, P. Liu and X. Ni, "15-kV/40-A FREEDM Supercascode: A Cost-Effective SiC High-Voltage and High-Frequency Power Switch", IEEE Transactions on Industry Applications, vol. 53, No. 6, pp. 5715-5727, Nov.-Dec. 2017.

L. Garcia Rodriguez, L. Gill, J. Mueller and J. Neely, "A High-Voltage Cascaded Solid-State DC Circuit Breaker Using Normally-On SiC JFETs", 2021 12th Energy Conversion Congress and Exposition Asia (ECCE Asia), 2021.

L. Zhang, S. Sen and A. Q. Huang, "7.2-kV/60-A Austin SuperMOS: An Intelligent Medium-Voltage SiC Power Switch", IEEE Journal of Emerging and Selected Topics in Power Electronics, vol. 8, No. 1, pp. 6-15, Mar. 2020.

L. Zhang, S. Sen, Z. Guo, X. Zhao, A. Q. Huang and X. Song, "7.2-kV/60-A Austin SuperMOS: An Enabling SiC Switch Technology for Medium Voltage Applications", 2019 IEEE Electric Ship Technologies Symposium (ESTS), pp. 523-529, 2019.

X. Lyu, H. Li, Z. Ma, B. Hu and J. Wang, "Dynamic Voltage Balancing for the High-Voltage SiC Super-Cascode Power Switch," in IEEE Journal of Emerging and Selected Topics in Power Electronics, vol. 7, No. 3, pp. 1566-1573, Sep. 2019.

X. Lyu, H. Li, Z. Ma, B. Hu and J. Wang, "Optimization Method to Eliminate Turn-on Overvoltage Issue of the High Voltage SiC Super-Cascode Power Switch", 2018 IEEE 4th Southern Power Electronics Conference (SPEC), pp. 1-6, 2018.

B. Hu et al., "Characterization and evaluation of 4.5 kV 40 A SiC super-cascode device", 2017 IEEE 5th Workshop on Wide Bandgap Power Devices and Applications (WiPDA), pp. 321-326, 2017.

X. Lyu, H. Li, B. Hu, Z. Ma and J. Wang, "High voltage SiC super-cascode power switch parameter optimization for loss reduction", 2018 IEEE Applied Power Electronics Conference and Exposition (APEC), pp. 1701-1705, 2018.

Bhalla, X. Li, P. Losee and M. Nava, "Ultra-High Voltage (40kV) Switches Implemented using SiC Super Cascodes", PCIM Europe 2019; International Exhibition and Conference for Power Electronics Intelligent Motion Renewable Energy and Energy Management, pp. 1-6, 2019.

X. Li, H. Zhang, P. Alexandrov and A. Bhalla, "Medium voltage power switch based on SiC JFETs", 2016 IEEE Applied Power Electronics Conference and Exposition (APEC), pp. 2973-2980, 2016.

P. Killeen, A. N. Ghule and D. C. Ludois, "Silicon Carbide JFET Super-Cascodes for Normally-On Current Source Inverter Switches in Medium Voltage Variable Speed Electrostatic Drives", 2019 IEEE Energy Conversion Congress and Exposition (ECCE), pp. 4004-4011, 2019.

J. L. Hostetler, P. Alexandrov, X. Li, L. Fursin and A. Bhalla, "6.5 kV SiC normally-off JFETs—Technology status", 2014 IEEE Workshop on Wide Bandgap Power Devices and Applications, pp. 143-146, 2014.

M. Roshandeh, Z. Miao, Z. A. Danyial, Y. Feng and Z. J. Shen, "Cascaded operation of SiC JFETs in medium voltage solid state circuit breakers", 2016 IEEE Energy Conversion Congress and Exposition (ECCE), pp. 1-6, 2016.

R. Rodrigues, Y. Du, A. Antoniazzi and P. Cairoli, "A Review of Solid-State Circuit Breakers", IEEE Transactions on Power Electronics, vol. 36, No. 1, pp. 364-377, Jan. 2021.

X. Zhang, Z. Yu, Z. Chen, Y. Huang, B. Zhao and R. Zeng, "Modular Design Methodology of DC Breaker Based on Discrete Metal Oxide Varistors With Series Power Electronic Devices for HVdc Application", IEEE Transactions on Industrial Electronics, vol. 66, No. 10, pp. 7653-7662, Oct. 2019.

Z. J. Shen, G. Sabui, Z. Miao and Z. Shuai, "Wide-Bandgap Solid-State Circuit Breakers for DC Power Systems: Device and Circuit Considerations", IEEE Transactions on Electron Devices, vol. 62, No. 2, pp. 294-300, Feb. 2015.

He, Z. Shuai, Z. Lei, W. Wang, X. Yang and Z. J. Shen, "A SiC JFET-Based Solid State Circuit Breaker With Digitally Controlled Current-Time Profiles", IEEE Journal of Emerging and Selected Topics in Power Electronics, vol. 7, No. 3, pp. 1556-1565, Sep. 2019.

(56) References Cited

OTHER PUBLICATIONS

Z. Miao, G. Sabui, A. Moradkhani Roshandeh and Z. J. Shen, "Design and Analysis of DC Solid-State Circuit Breakers Using SiC JFETs", IEEE Journal of Emerging and Selected Topics in Power Electronics, vol. 4, No. 3, pp. 863-873, Sep. 2016.

Zhang, X. Yang, W. Chen and L. Wang, "Voltage Balancing Control of Series-Connected SiC MOSFETs by Using Energy Recovery Snubber Circuits", IEEE Transactions on Power Electronics, vol. 35, No. 10, pp. 10200-10212, Oct. 2020.

Y. Ren et al., "Stability Analysis and Improvement for SSCB With Single-Gate Controlled Series-Connected SiC MOSFETs", IEEE Transactions on Industrial Electronics, vol. 68, No. 9, pp. 8093-8103, Sep. 2021.

L. Mackey, C. Peng and I. Husain, "A Progressive Switching Scheme for Solid-State DC Circuit Breakers", 2018 9th IEEE International Symposium on Power Electronics for Distributed Generation Systems (PEDG), pp. 1-6, 2018.

C. Abbate, G. Busatto and F. Iannuzzo, "High-Voltage High-Performance Switch Using Series-Connected IGBTs", IEEE Transactions on Power Electronics, vol. 25, No. 9, pp. 2450-2459, Sep. 2010.

R. Withanage and N. Shammas, "Series Connection of Insulated Gate Bipolar Transistors (IGBTs)", IEEE Transactions on Power Electronics, vol. 27, No. 4, pp. 2204-2212, Apr. 2012.

T. C. Lim, B. W. Williams, S. J. Finney and P. R. Palmer, "Series-Connected IGBTs Using Active Voltage Control Technique", IEEE Transactions on Power Electronics, vol. 28, No. 8, pp. 4083-4103, Aug. 2013.

J. Liu, L. Ravi, D. Dong and R. Burgos, "A Single Passive Gate-Driver for Series-Connected Power Devices in DC Circuit Breaker Applications", IEEE Transactions on Power Electronics, vol. 36, No. 10, pp. 11031-11035, Oct. 2021.

X. Wu, S. Cheng, Q. Xiao and K. Sheng, "A 3600 V/80 A Series—Parallel-Connected Silicon Carbide MOSFETs Module With a Single External Gate Driver", IEEE Transactions on Power Electronics, vol. 29, No. 5, pp. 2296-2306, May 2014.

Y. Ren et al., "A Compact Gate Control and Voltage-Balancing Circuit for Series-Connected SiC MOSFETs and Its Application in a DC Breaker", IEEE Transactions on Industrial Electronics, vol. 64, No. 10, pp. 8299-8309, Oct. 2017.

Y. Ren, X. Yang, F. Zhang, F. Wang, L. M. Tolbert and Y. Pei, "A Single Gate Driver Based Solid-State Circuit Breaker Using Series Connected SiC MOSFETs", IEEE Transactions on Power Electronics, vol. 34, No. 3, pp. 2002-2006, Mar. 2019.

C. Li, S. Chen, H. Luo, C. Li, W. Li and X. He, "A Modified RC Snubber With Coupled Inductor for Active Voltage Balancing of Series-Connected SiC MOSFETs", IEEE Transactions on Power Electronics, vol. 36, No. 10, pp. 11208-11220, Oct. 2021.

V. Jones, R. A. Fantino and J. C. Balda, "A Modular Switching Position With Voltage-Balancing and Self-Powering for Series Device Connection", IEEE Journal of Emerging and Selected Topics in Power Electronics, vol. 9, No. 3, pp. 3501-3516, Jun. 2021.

L. Pang, T. Long, K. He, Y. Huang and Q. Zhang, "A Compact Series-Connected SiC MOSFETs Module and Its Application in High Voltage Nanosecond Pulse Generator", IEEE Transactions on Industrial Electronics, vol. 66, No. 12, pp. 9238-9247, Dec. 2019.

Marzoughi, R. Burgos and D. Boroyevich, "Active Gate-Driver With dv/dt Controller for Dynamic Voltage Balancing in Series-Connected SiC MOSFETs", IEEE Transactions on Industrial Electronics, vol. 66, No. 4, pp. 2488-2498, Apr. 2019.

X. Yao, "Study on DC arc faults in ring-bus DC microgrids with constant power loads", 2016 IEEE Energy Conversion Congress and Exposition (ECCE), pp. 1-5, 2016.

M. E. Baran and N. R. Mahajan, "DC distribution for industrial systems: opportunities and challenges", IEEE Transactions on Industry Applications, vol. 39, No. 6, pp. 1596-1601, Nov.-Dec. 2003.

Z. J. Shen, A. M. Roshandeh, Z. Miao and G. Sabui, "Ultrafast autonomous solid state circuit breakers for shipboard DC power distribution", 2015 IEEE Electric Ship Technologies Symposium (ESTS), pp. 299-305, 2015.

X. Pei, O. Cwikowski, D. S. Vilchis-Rodriguez, M. Barnes, A. C. Smith and R. Shuttleworth, "A review of technologies for MVDC circuit breakers", IECON 2016—42nd Annual Conference of the IEEE Industrial Electronics Society, pp. 3799-3805, 2016.

Shukla and G. D. Demetriades, "A Survey on Hybrid Circuit-Breaker Topologies", IEEE Transactions on Power Delivery, vol. 30, No. 2, pp. 627-641, Apr. 2015.

R. Wang, B. Zhang, S. Zhao, L. Liang and Y. Chen, "Design of an IGBT-series-based Solid-State Circuit Breaker for Battery Energy Storage System Terminal in Solid-State Transformer", IECON 2019—45th Annual Conference of the IEEE Industrial Electronics Society, pp. 6677-6682, 2019.

O. A. Ciniglio, D. P. Carroll and H. Mehta, "The application of photoconductive switches in HVDC circuit interruption," in IEEE Transactions on Power Delivery, vol. 5, No. 1, pp. 460-466, Jan. 1990, doi: 10.1109/61.107313.

Andrew D. Koehler et al., "High Voltage GaN Lateral Photoconductive Semiconductor Switches," ECS Journal of Solid State Science and Technology, 6 (11) S3099-S3102 (2017), 5 pages.

G.W. Pickrell et al., "Advanced GaN Device Technologies for Power Electronics," SAND2018-10913C, Sandia National Laboratories (2018), 27 pages.

G.M. Loubriel et al., "Photoconductive Semiconductor Switches: Laser Q-switch Trigger and Switch-Trigger Laser Integration," SAND97-3111, Sandia National Laboratories (1997), 28 pages.

G. Pickrell et al., "ARC-Safe: Accelerated Response Semiconducting Contactors and Surge Attenuation For DC Electrical Systems," SAND2020-8298PE, Sandia National Laboratories (2020), 20 pages.

* cited by examiner

OPTICALLY SWITCHED CIRCUIT BREAKER WITH CASCADED TRANSISTOR TOPOLOGY

CROSS-REFERENCE TO RELATED APPLICATION

This application is a continuation-in-part of U.S. Pat. No. 11,728,804, filed on May 5, 2022, and issued on Aug. 15, 2023.

NOTICE OF GOVERNMENT RIGHTS

This invention was made with Government support under Contract No. DE-NA0003525 awarded by the United States Department of Energy/National Nuclear Security Administration. The Government has certain rights in the invention.

Field of the Invention

The present disclosure relates to wide-bandgap power semiconductor devices. In a more particular aspect, the disclosure relates to apparatus in which such devices are used for high-voltage switching.

Art Background

It has long been known that a junction field-effect transistor (JFET) fabricated from a wide-bandgap material such as silicon carbide (SiC) offers certain advantages when it is used as a high-voltage switching device, particularly for high-power applications. Recognized advantages of a JFET based, e.g., on SiC, include low ON-resistance per chip area and high breakdown voltage. Because both the output capacitance and the Miller capacitance tend to be relatively low, another potential advantage is low switching loss. It has also been recognized that because a typical JFET lacks a gate oxide layer, it can potentially be more reliable than a comparable MOSFET under severe conditions that could cause a gate oxide to degenerate.

However, the SiC JFET operates in depletion mode. Because of that, its inherent operating mode is normally-ON. As such, the JFET requires active application of a negative gate voltage to turn it OFF and to maintain it in the OFF condition. This can be inconvenient for some applications. Further, it can pose a safety risk because a fault in the control circuit could potentially create an unintended conductive path for high current at high voltage.

For those reasons, among others, it has been conventional to add a controlling transistor in the form of a low-voltage MOSFET, which is a normally-OFF transistor. The control signal takes the form of a gating potential applied across the gate and source of the MOSFET. Under the control of the MOSFET, the resulting circuit has normally-OFF behavior.

The term "cascode" has been applied to denote circuit configurations in which the switching behavior of a single JFET is controlled by a MOSFET, such as a low-voltage silicon or SiC MOSFET. It is also possible to cascade multiple JFETs in order to increase the voltage rating of the switch circuit. SiC JFETs, in particular, are advantageous in this regard because of the advantages mentioned above. The term "super cascode" has been applied to denote circuit configurations in which a MOSFET is used as the control device to control two or more JFETs that are cascaded in series. By "series" in this regard, we mean that the drain terminal of each JFET is connected to the source terminal of the next JFET in sequence.

A useful review of several different super cascode configurations can be found in L. Gill et al., "A Comparative Study of SiC JFET Super-Cascode Topologies," 2021 IEEE Energy Conversion Congress and Exposition (ECCE) (2021) 1741-1748, the entirety of which is hereby incorporated herein by reference.

Super cascode configurations are beneficial because they combine some of the advantages that cascaded JFETs offer with the safety and convenience provided by using a MOSFET for control. However, it is typical for the control device to be a low-voltage silicon MOSFET. The voltage rating of such a device must be considered in the design of the super cascode circuit, which consequently limits the voltage rating of the switch as a whole.

Further, disparities both in the voltage rating and in the ON-resistance between the MOSFET and the JFETs tend to complicate the circuit design, and physically, they may lead to serious localized thermal stresses. The controlling MOSFET may also be subject to failure due to degradation of the gate oxide, as mentioned above.

There is, then, a need for new circuit configurations for high-voltage switching that can extend the capabilities of cascaded JFETs.

SUMMARY OF THE INVENTION

We have provided a new switch topology, in which a cascaded JFET configuration or other transistor configuration is operated without using a control MOSFET or other added control device. This can provide several benefits, including a more uniform thermal distribution across the devices which can, in turn, facilitate better thermal management. Moreover, absent the MOSFET, the full benefit of the low ON-resistance of the cascaded JFETs or other transistors can be realized. Further, the resilience of wide-bandwidth devices such as JFETs to harsh conditions can be fully enjoyed, leading to greater reliability under large surge currents and repeated switching stress, for example.

A feature of our switch topology is a new type of voltage-balancing network, which offers improved performance when there are significant leakage currents.

That is, it is a known technique to use a passive balancing network to distribute the total supply voltage across the switch in approximately equal increments, as measured between the drain and source terminals of the JFETs or other transistors. The balancing network includes a network of voltage-dividing resistors. Conduction through the balancing resistors can lead to power loss.

The power loss can be reduced by increasing the resistances in the network, as may be desirable at relatively high voltages. However, leakage currents entering the balancing resistors from the, e.g., JFET gate terminals add to the voltage drops across the resistors. The leakage currents accumulate down the chain of resistors, exacerbating the voltage drops and potentially causing harmful voltage imbalances. This problem can be made worse by increasing the resistances of the individual resistors. This is another effect that, in practice, can limit the voltage ratings that can be achieved for a switch that uses a super cascode or similar series-connected structure.

Our new switch topology is characterized by distinct parallel paths in the resistor network. This more evenly distributes the leakage currents while maintaining low power loss through the resistors.

U.S. patent application Ser. No. 17/737,593 disclosed subject matter relates to a switching apparatus comprising at least a first plurality of n transistors connected in series, in which n is a positive integer at least 3. Each of the transistors has its own source, drain, and gate terminals. In non-limiting examples, the transistors may be silicon carbide or other wide-bandgap material JFETs, they may be GaN transistors, they may be normally-ON devices, and they may be normally-OFF devices.

The first plurality of n transistors includes a first transistor $J_1$, a last transistor $J_n$, and at least one transistor $J_i$, i having respective positive integer values between 1 and n.

The switching apparatus also comprises a terminal S, also referred to herein as "Source," which is connected to the $J_1$ source terminal, a terminal D, also referred to herein as "Drain," which is connected to the $J_n$ drain terminal, and a control terminal G connected to the $J_1$ gate terminal.

The switching apparatus also comprises, connected between terminal S and terminal D, a dedicated voltage-balancing network that includes a number, at least two, of parallel-connected resistive legs. In each of the parallel-connected resistive legs, there are two or more series-connected resistors. For each transistor after $J_1$, the pertinent gate terminal connects to one of the parallel-connected resistive legs such that the parallel-connected resistive legs collectively constitute a voltage divider for dividing voltage across the series-connected transistors.

One application for a switching apparatus as described above is for a circuit breaker. We have developed a circuit breaker that includes the disclosed switching apparatus, and that also includes a switchable bypass leg that is optically switched using a photoconductive semiconductor switch (PCSS).

Accordingly, the present disclosure relates in one aspect to a switching apparatus having a power input terminal for electric power and a load terminal for connection to a load. The switching apparatus comprises a transistor switch circuit connected between the power input terminal and the load terminal, and a switchable bypass leg connected to the power input terminal and bypassing the transistor switch circuit. The switchable bypass leg includes a series-connected photoconductive semiconductor switch (PCSS). The switchable bypass leg is configured to be optically switchable by the PCSS.

The transistor switch circuit comprises at least a first plurality of n series-connected transistors, each of said transistors having a respective source terminal, a respective drain terminal, and a respective gate terminal, wherein for n a positive integer at least 3, the first plurality of n series-connected transistors includes a first transistor herein denominated $J_1$, a last transistor herein denominated $J_n$, and at least one transistor herein denominated $J_i$, i having respective positive integer values between 1 and n.

The transistor switch circuit further comprises a terminal S connected to the $J_1$ source terminal, a terminal D connected to the $J_n$ drain terminal, a control terminal G connected to the $J_1$ gate terminal, and a dedicated voltage-balancing network connected between terminal S and terminal D.

The dedicated voltage-balancing network includes a number, at least two, of parallel-connected resistive legs, each parallel-connected resistive leg including two or more series-connected resistors. For each transistor after $J_1$, the pertinent gate terminal connects to one of the parallel-connected resistive legs such that the parallel-connected resistive legs collectively constitute a voltage divider for dividing voltage across the series-connected transistors.

In embodiments, the transistor switch circuit further comprises at least one partial transistor stack, wherein each said partial transistor stack comprises a number p of transistors that is at least 1 but less than n, and each said partial transistor stack is connected in parallel across the transistors $J_1$ to $J_p$ of a respective plurality of n series-connected transistors.

In embodiments, the switchable bypass leg includes a capacitor series-connected with the PCSS.

In embodiments, the switching apparatus further comprises a load current sensor configured to measure a load current exiting the load terminal, and a controller. The controller is connected to the load current sensor and configured to receive, from the load current sensor, a signal $S(I_L)$ indicative of a load current. The controller is configured to infer the presence of a hard fault condition from the signal $S(I_L)$ and to declare an instant-trip state in response thereto, and the controller is configured to, when in the instant-trip state, first open the transistor switch circuit and then close the switchable bypass leg to enable conduction of a bypass current in the switchable bypass leg when the hard fault condition is inferred.

In further embodiments, the switching apparatus is configured to enter a no-trip state, a delayed-trip state, or an instant-trip state, depending on the signal $S(I_L)$, and configured such that when the hard fault condition is inferred, the controller will cause the apparatus to enter the instant-trip state. The controller is further configured such that opening of the transistor switch circuit is not permitted in the no-trip state, opening of the transistor switch circuit is permitted in the delayed-trip state only when the load current is within a predetermined range of currents, and opening of the transistor switch circuit occurs promptly in the instant-trip state when the hard fault condition is inferred.

In further embodiments, the controller is configured such that opening of the transistor switch circuit in the delayed-trip state occurs after a time interval in which a cumulative amount of electrothermal energy determined from the signal $S(I_L)$ reaches a predetermined energy threshold.

In embodiments, the switching apparatus further comprises an optical source, the controller is configured to close the switchable bypass leg by sending a trigger signal to turn ON the optical source, the optical source is configured to switch closed the PCSS, and the controller is further configured to send the trigger signal at a specified time after the opening of the transistor switch circuit.

In embodiments, the controller is configured to close the switchable bypass leg by sending a trigger signal to turn ON an optical source for switching closed the PCSS, and the controller is further configured to send the trigger signal at a specified time after the opening of the transistor switch circuit. In further embodiments, the PCSS has a voltage threshold for a high-gain mode, and the specified time for sending the trigger signal is a time when a voltage across the PCSS is above the voltage threshold for the high-gain mode.

In embodiments, the switchable bypass leg further includes a capacitor series-connected to the PCSS and to the load terminal.

In embodiments, the switchable bypass leg further includes a capacitor series-connected to the PCSS and to ground, the switchable bypass leg thereby bypassing the load terminal.

In embodiments, the at least a first plurality of n series-connected transistors is at least a first plurality of n series-connected JFETs.

In a second aspect, the present disclosure relates to a method practiced in a power circuit. The method comprises sensing an electric current I on an input path directed to a load terminal for connecting to a load, detecting whether the sensed electric current I is in a fault condition, opening a transistor switch circuit in response to a detection of a fault condition, resulting in breaking of the input path directed to the load terminal, and then closing a photoconductive semiconductor switch (PCSS), resulting in diverting the electric current onto a switchable bypass path that bypasses the transistor switch circuit. The opening of the transistor switch circuit comprises turning OFF a normally-ON transistor switch circuit.

Further, the transistor switch circuit comprises at least one cascaded series of three or more transistors, including a bottom transistor at a bottom end of the series and a top transistor at a top end of the series. In each said cascaded series, a terminal S is connected to a source terminal of the bottom transistor, and a terminal D is connected to a drain terminal of the top transistor. For each said cascaded series, a dedicated voltage-balancing network comprising at least two parallel-connected resistive legs is connected between terminal S and terminal D as a voltage divider for dividing voltage across the cascaded series. Each parallel-connected resistive leg comprises two or more series-connected resistors.

In embodiments, the method further comprises declaring, in response to the sensing of the electric current I, one of a no-trip state, a delayed-trip state, or an instant-trip state, the opening of the transistor switch circuit is not permitted from the no-trip state, from the delayed-trip state, the opening of the transistor switch circuit is permitted only when the sensed electric current I is within a predetermined range of currents, and the opening of the transistor switch circuit occurs promptly upon declaring the instant-trip state.

In embodiments, the method further comprises, when in the delayed-trip state, computing a cumulative amount of electrothermal energy in response to the sensing of the electric current I, the method further comprises, when in the delayed-trip state, determining if the cumulative amount of electrothermal energy has reached a delayed-trip trigger threshold, and the opening of the transistor switch circuit from the delayed-trip state occurs upon determination that the cumulative amount of electrothermal energy has reached the delayed-trip trigger threshold.

In further embodiments, the said states of the controller are responsive to a comparison of the sensed electric current I to a first current threshold $\Theta_1$ and to a second current threshold $\Theta_2$ greater than $\Theta_1$, such that for I<$\Theta_1$, the no-trip state is a stable state of the controller, for $\Theta_1$<I<$\Theta_2$, the delayed-trip state is a stable state of the controller until the delayed-trip trigger threshold is reached, and for/at least $\Theta_2$, the instant-trip state is declared.

In embodiments, the closing of the PCSS comprises sending a trigger signal to turn ON an optical source for switching closed the PCSS, and the trigger signal is sent at a predetermined time after the opening of the transistor switch circuit. In further embodiments, the PCSS has a voltage threshold for a lock-on mode of operation; and the predetermined time for sending the trigger signal is a time when a voltage across the PCSS is above the voltage threshold for the lock-on mode.

In embodiments, the switchable bypass path that bypasses the transistor switch circuit passes through a capacitor to the load terminal. In other embodiments, the switchable bypass path that bypasses the transistor switch circuit passes through a capacitor to ground and bypasses the load terminal.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

In FIGS. 13 and 14, the line current, the calculated electrothermal energy, and the trip signal are plotted against a common timescale. FIG. 13 represents an overcurrent transient caused by the inrush current of a downstream capacitive load. FIG. 14 represents an instability in the line current driven by resonant behavior.

FIG. 20 shows the same transient response, in the same circuit, as FIG. 19, but on a shorter timescale of about 2 µs.

FIG. 21 shows, on a timescale of about 2 µs, the transient response in the unsuccessful operation of an experimentally tested prototype circuit breaker. In the trial represented by FIG. 21, the PCSS fired too early and, as a consequence, it did not achieve lock-on.

DETAILED DESCRIPTION

Figure 1:
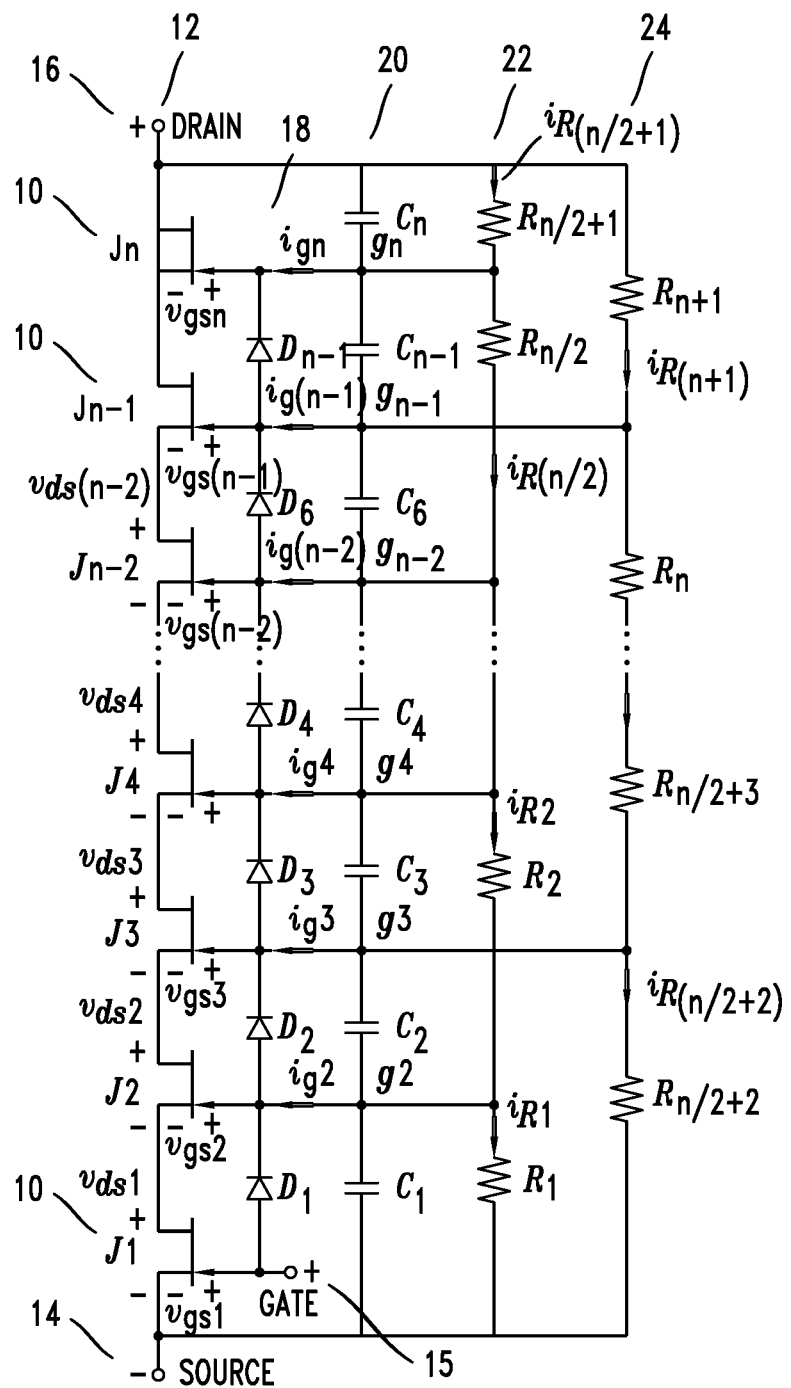
FIG. 1 is a simplified schematic diagram of a switch circuit in an example embodiment having an arbitrary number of JFETs.

FIG. 1 is a simplified schematic diagram of a switching apparatus in an example embodiment in which the transistor devices are JFETs. It should be noted, however, that although a switching apparatus based on JFETs is particularly desirable for certain applications, the choice of JFETs in the following description is not meant to be limiting. Rather, the principles described below can be implemented with any of various types of three-terminal devices, not least of which are HEMTs and other power transistors. It should also be understood that although JFETs, as in the example embodiment described here, are normally-ON devices, the principles described below can be implemented using normally-OFF devices as well, and such implementations are within the scope of the present disclosure.

As will be seen below, the material composition of example JFETs suitable for use in an illustrative embodiment is silicon carbide. However, transistor devices of any of various semiconductor compositions, especially those formed of wide-bandgap materials, may also be suitable for use in alternate embodiments. Not least of these compositions, by way of example, are gallium nitride (GaN) and aluminum gallium nitride (AlGaN). Embodiments having any material composition suitable for implementing the principles described below are within the scope of the present disclosure.

The switching apparatus, as shown, has various applications including applications as a high-voltage circuit breaker. As shown, an integer number n of JFETs 10, exemplarily SiC JFETs, are connected in series. The minimum number for n is 3. The n JFETs 10 constitute a JFET leg 12 of the circuit. As will be explained below, the JFET leg 12 is controllable to provide blocking, between the terminals 14, 16, respectively labeled "Source" and "Drain," of a dc voltage $V_{DC}$ from a voltage source, which is not shown in FIG. 1. In other embodiments, there may be two or more JFET legs 12, as explained in more detail below.

As shown, the Source terminal 14 of the switching apparatus is connected to the source terminal of $J_1$, and the Drain terminal 16 of the switching apparatus is connected to the drain terminal of $J_n$.

Also shown in FIG. 1 is a leg 18 constituted by series-connected avalanche diodes $D_1$-$D_{n-1}$, and a leg 20 constituted by series-connected capacitors $C_1$-$C_n$. Each avalanche diode is connected between the gates of two sequential JFETs. Likewise, each capacitor is connected between the gates of two sequential JFETs, except that $C_1$ is connected between the Source terminal 14 and the gate terminal of $J_2$, and $C_n$ is connected between the gate terminal of $J_n$ and the Drain terminal 16.

The avalanche diodes are to protect the transistors (i.e., the JFETs 10, in the present example) in the event that an overvoltage greater than $V_{DC}/n$ is applied across any of them. The capacitors are designed to dynamically balance the voltage during the ON and OFF transitions, which will be described below.

FIG. 1 also shows a balancing network of resistors $R_1$-$R_{n+1}$, which is connected between the Source terminal 14 and the Drain terminal 16 to balance the static voltage across the JFET leg 12. It is noteworthy that this static balancing network comprises more than one leg of series-connected resistors. The illustrated example has two legs 22, 24. One leg 22 comprises resistors $R_1$ to $R_{(n/2)+1}$, and the other leg 24 comprises resistors $R_{(n/2)+2}$ to $R_{n+1}$. In alternate embodiments, the passive balancing network may have three legs, or even more, up to a maximum of n−1.

As those skilled in the art will recognize, individual circuit elements such as transistors, resistors, and capacitors may be replaced by networks of multiple elements having equivalent function, such as serial networks, parallel networks, or serial-parallel networks, without deviating from the principles described here. Hence, any reference to an individual circuit element is meant to encompass equivalent networks of such components.

In the illustrated example, each resistor, with certain exceptions, is connected between the gates of two JFETs 10 that are separated in sequence by one intervening JFET 10, with staggering by one JFET position between the two legs 22 and 24. The exceptions are:

$R_1$ is connected between the Source terminal 14 and the $J_2$ gate terminal;

$R_{(n/2)+1}$ is connected between the $J_n$ gate terminal and the Drain terminal 16;

$R_{(n/2)+2}$ is connected between the Source terminal 14 and the $J_3$ gate terminal; and $R_{n+1}$ is connected between the $J_{n-1}$ gate terminal and the Drain terminal 16.

The gate terminals of the JFETs 10 (more specifically, the points of connection between the respective gate terminals and the capacitor leg 20) are labeled $g_2, g_3, \ldots, g_n$ in FIG. 1. Various voltages and currents are also labeled in FIG. 1. For convenient reference, they are defined in Table 1.

Accordingly, it will be seen that in the left resistor leg 22 (in the view of FIG. 1), the bottom resistor is connected between the Source terminal 14 and the $J_2$ gate, the top resistor is connected between the top JFET gate and the Drain terminal 16, and all other resistors are connected between gates of even-numbered JFETs. In the right leg 24 (in the view of FIG. 1), the bottom resistor is connected between the Source terminal 14 and the J3 gate, the top resistor is connected between the second-from-top JFET gate and the Drain terminal 16, and all other resistors are connected between gates of odd-numbered JFETs 10. This scheme can be implemented for n=4, and it can be extended to greater numbers of JFETs 10 and balancing resistors.

As mentioned above, alternate embodiments may include two or more JFET legs 12. For example, the entire network constituted by the JFET leg 12, the avalanche diode leg 18, the capacitor leg 20, and the resistive balancing network as represented, e.g., by resistor legs 22 and 24 of FIG. 1 can be taken as a unit and duplicated one or more times, so that two or more such units are connected in parallel between the Source terminal 14 and the Drain terminal 16. In such a parallel arrangement, each JFET leg 12 will have a dedicated voltage balancing network. Such a parallel arrangement may be advantageous, in at least some cases, for mitigating stresses caused by high electric current. In other approaches, it may be possible to duplicate the JFET leg 12 without duplicating legs 22 and 24 of the balancing network, so that multiple JFET legs 12 will have a shared voltage balancing network. However, such an approach would complicate the task of voltage balancing.

TABLE 1

| | |
|---|---|
| $V_{DC}$ | Supply Voltage |
| $V_{th}$ | JFET Threshold Voltage |
| $V_{G-}$ | JFET Turn-OFF Voltage |
| $V_{G+}$ | JFET Turn-ON Voltage |
| $V_{gs}(I_0)$ | Gate-to-Source Voltage at Full Load Current |
| $v_{gs}$ | Gate-to-Source Voltage ("Gate Voltage") |
| $v_{gsi}$ | Gate-to-Source Voltage, i'th JFET |
| $v_{ds}$ | Drain-to-Source Voltage ("Drain Voltage") |
| $v_{dsi}$ | Drain-to-Source Voltage, i'th JFET |
| $i_g$ | Gate Current |
| $i_{gi}$ | Gate Current, i'th JFET |
| $i_{Ri}$ | Resistor Current, i'th Resistor |
| $i_d$ | Drain Current |
| $I_0$ | Total Load Current |
| $i_{DC}$ | The Current Through the JFET Leg |
| $R_{gi}$ | Gate Resistance, i'th JFET |
| $C_{gs}$ | Gate-to-Source Capacitance |
| $C_{gsi}$ | Gate-to-Source Capacitance, i'th JFET |
| $C_{gd}$ | Gate-to-Drain Capacitance |
| $C_{gdi}$ | Gate-to-Drain Capacitance, i'th JFET |

We will now briefly describe the operation of the switching apparatus, which for conciseness, but not for limitation, we refer to below as the "switch circuit." A more detailed discussion can be found in Luciano A. Garcia Rodriguez, et al., "A High-Voltage Cascaded Solid-State DC Circuit Breaker Using Normally-ON SiC JFETs," 2021 IEEE 12th Energy Conversion Congress & Exposition-Asia (ECCE-Asia) (2021) 1554-1561, the entirety of which is hereby incorporated herein by reference.

Turn-ON Process. We will first describe the turn-ON process. It is noteworthy in this regard that JFETs 10 are normally-ON devices. In order to maintain the switching apparatus in an OFF state, it is therefore necessary to use an ancillary circuit to supply a controlling voltage suitable to maintain the JFETs 10 in their OFF state. Such an ancillary circuit can be powered by power sources of various kinds, including, without limitation, batteries and taps from the high-voltage source. One advantage of using a high-voltage tap is that it offers assurance of continual control, even in a short-circuit event. An example of an ancillary circuit powered from a high-voltage tap will be provided below.

For purposes of discussion, we take the steady-state OFF condition of the switch circuit as the initial condition. In this OFF condition, the total dc voltage $V_{DC}$ is divided evenly among the n JFETs 10. The gate-to-source voltages (referred to below as "gate voltages") of the JFETs 10 are at a level slightly below the threshold voltage $V_{th}$, except for $V_{gs1}$, which is at a subthreshold voltage $V_{G-}$; i.e., $V_{G-} < V_{th}$. The voltage across each balancing capacitor is $V_{DC}/n$, except that the voltages across $C_1$ and $C_n$ are $V_{DC}/n + V_{th}$ and $V_{DC}/n - V_{th}$, respectively. Due to their high values, the balancing resistors $R_1$ to $R_{n+1}$ have no significant effect on the turn-ON and turn-OFF processes. Hence, we treat them as open circuits in the following discussion.

Figure 2:
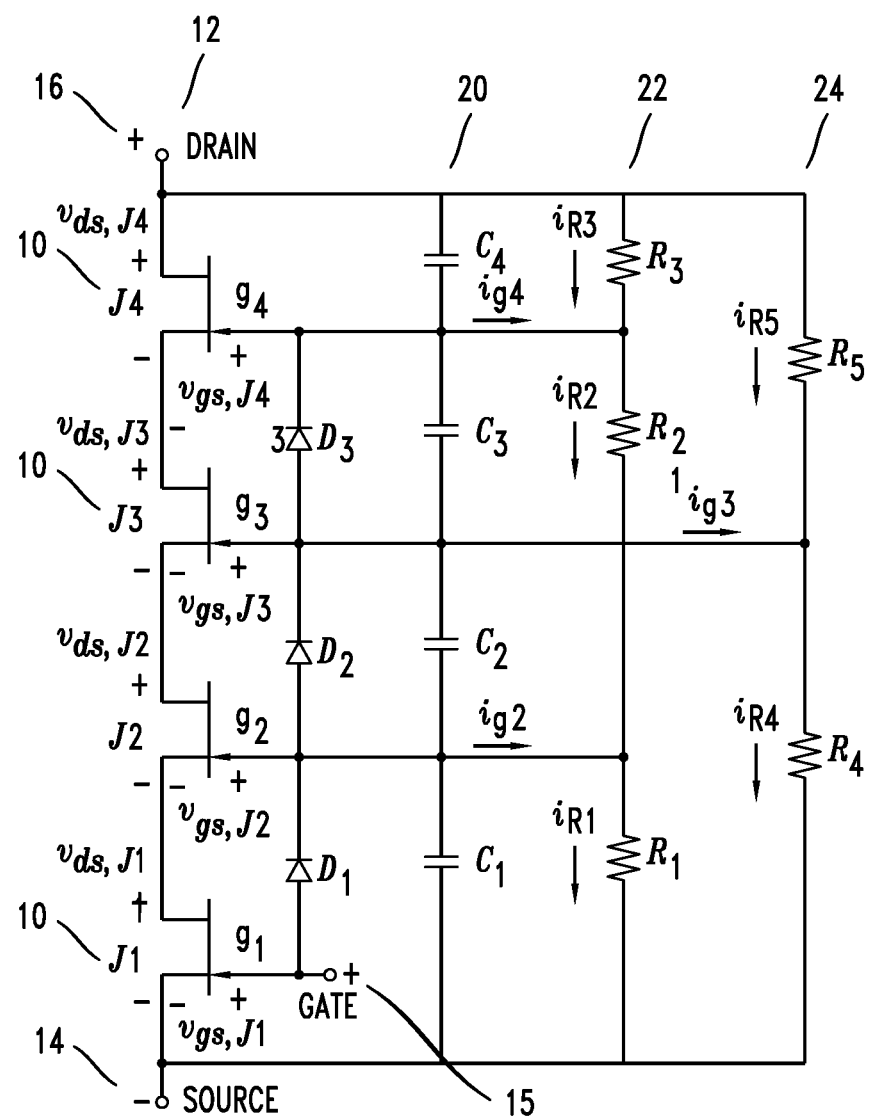
FIG. 2 is a simplified schematic diagram of a switch circuit in an example embodiment having four JFETs.

For simplicity of presentation, the following analysis is directed to an illustrative embodiment in which there are four JFETs 10, denominated $J_1$, $J_2$, $J_3$, and $J_4$, respectively. The corresponding circuit diagram is shown in FIG. 2. Figure elements that are common to FIGS. 1 and 2 are identified using like reference numerals.

Figure 3:
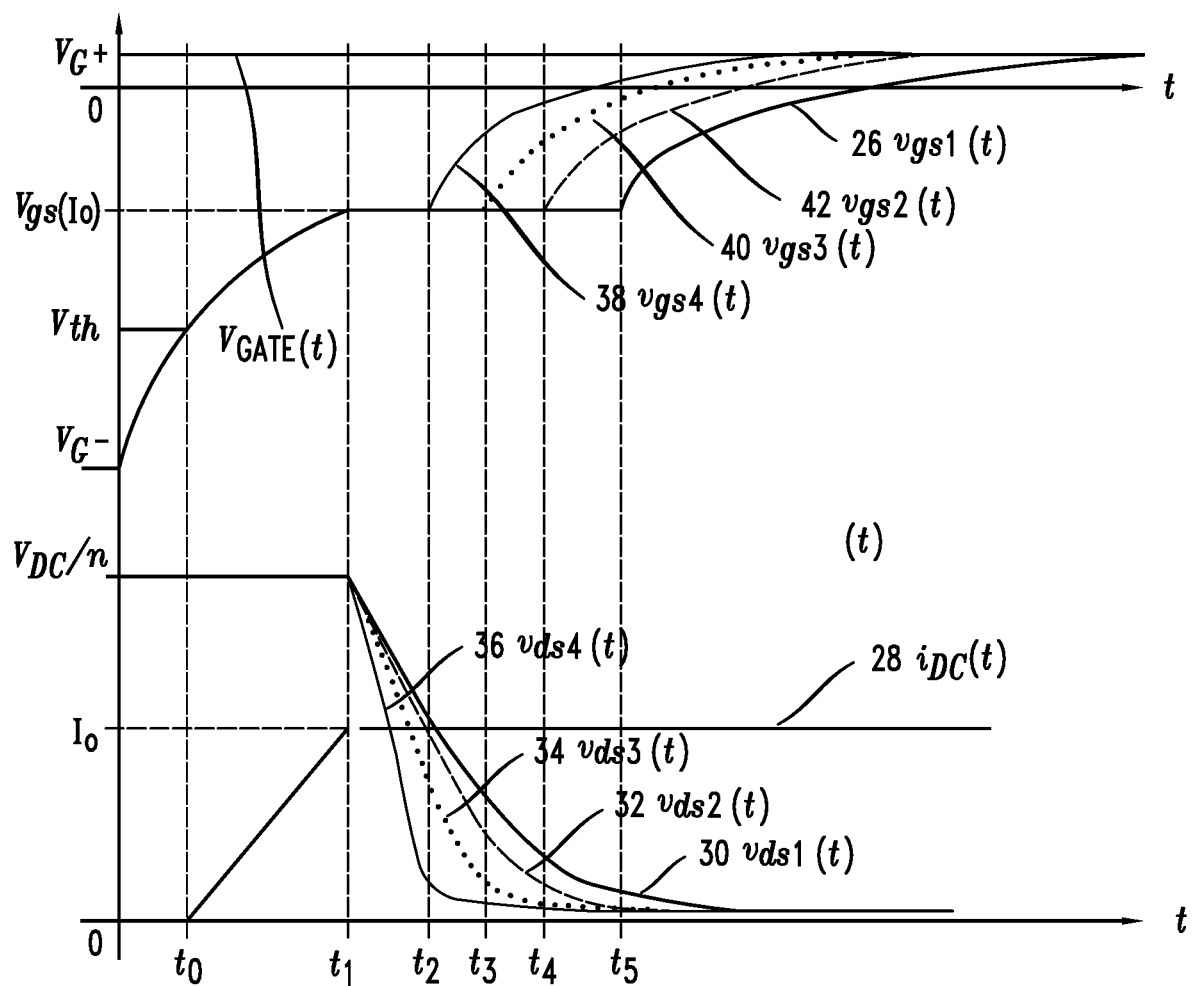
FIG. 3 is a graph of the predicted waveforms of the respective gate-to-source and drain-to-source voltages of the respective JFETs during the turn-ON process of an illustrative switch circuit. The predicted waveform of the current $i_{DC}$ in the switch circuit is also shown.

We performed a modeling study to predict the waveforms during the turn-ON process for the respective gate and drain voltages, as well as for the current $i_{DC}$ through the JFET leg 12. The model that we used assumes an inductive load, as is common practice for modeling the behavior of power converters, although in practical applications, the load can have any combination of inductive, capacitive, and resistive components. Our model includes a free-wheeling diode together with the inductive load, in accordance with the well-known double pulse test (DPT) circuit configuration. Results of our modeling study, indicative of switching behavior, are shown in FIG. 3, to which attention will be drawn in the following discussion.

Interval 0, from t=0 to t=$t_0$. The process is initiated by raising the voltage $v_{Gate}$ applied to control terminal 15 (i.e., the terminal "Gate" connected to the $J_1$ gate terminal) to the steady value $V_{G+}$, which will typically be several volts, for example 3V. This causes the voltage $v_{gs1}$ to begin rising from its initial value $V_{G-}$, while $v_{ds1}$ remains constant at $V_{DC}/4$. The capacitances $C_{ds}$, $C_{gs}$, and $C_{gd}$, which are not expressly indicated in FIGS. 1 and 2, are inherent properties of the JFET devices.

The $J_1$ gate current, $i_{g1}$, conducts through $C_{gs1}$ to the Source terminal 14, and it also conducts through $C_{gd1}$. Because $C_{gd1}$ is much smaller than $C_{gs1}$, the effect of $C_{gd1}$ is neglected in this analysis. Because the drain-to-source capacitances of the JFETs 10 are also very small, their effects are likewise neglected in this analysis.

An analytical calculation yields the following expression for the evolution of the $J_1$ gate voltage in this interval:

$$v_{gs1} = V_{G+} + (V_{G-} - V_{G+}) \cdot \exp(-t/(R_{g1} C_{gs1})). \quad \text{(I)}$$

The time interval 0 ends at time $t_0$, when $v_{gs1}$ reaches the threshold value $V_{th}$. The time $t_0$ is given by:

$$t_0 = R_{g1} C_{gs1} \ln[(V_{G-} - V_{G+})/(V_{th} - V_{G+})]. \quad \text{(II)}$$

Turning to FIG. 3, it will be seen (curve 26) that $v_{gs1}$ has begun to rise, starting at t=0, and that at t=$t_0$, the curve representing $v_{gs1}$ crosses the level marked $V_{th}$.

Interval 1, from t=$t_0$ to t=$t_1$. When t>$t_0$, all JFETs 10 have a gate voltage greater than $V_{th}$, so they all begin to conduct, as indicated by the rise in curve 28, which is the curve for $i_{DC}$ in FIG. 3. The reason for this is that when $J_1$ reaches threshold, its channel begins to conduct current, causing a small decrease in the $J_1$ drain voltage. According to the series connection of the JFET leg 12, the $J_1$ drain terminal is connected to the $J_2$ source terminal. Hence, the voltage drop at the $J_1$ drain terminal raises the $J_2$ gate voltage relative to the voltage at the $J_2$ source terminal. This change raises the $J_2$ gate voltage above threshold and causes $J_2$ to conduct. The same process continues to propagate very rapidly up the JFET leg 12 in a chain reaction until all JFETs 10 are conducting.

For all of the JFETs 10, the drain voltage $v_{ds}$ is now greater than $v_{gs} - V_{th}$, which places all of the JFETs 10 in the saturation region. Hence, the drain current $i_d$ of each JFET 10 is given by:

$$i_d = g_m(v_{gs} - V_{th}), \quad \text{(III)}$$

where $g_m$ is the JFET transconductance.

Since all JFETs 10 have the same current $i_d = i_{DC}$, the gate voltages $v_{gs}$ are also equal, assuming that the JFETs 10 are identical. Interval 1 ends at time $t_2$, when $i_d = I_0$. Analytical calculations predict the duration of Interval 1 as:

$$t_1 - t_0 = R_{g1} C_{gs1} \ln[(V_{th} - V_{G+})/((I_0/g_m) + V_{th} - V_{G+})]. \quad \text{(IV)}$$

Turning to FIG. 3, it will be seen that $i_{DC}$ rises linearly in Interval 1. The drain voltages of all of the JFETs 10, respectively represented in FIG. 3 by curves 30, 32, 34, and 36, remain steady at $V_{DC}/4$.

Interval 2, from t=$t_1$ to t=$t_5$. The switch circuit has begun to conduct the entire load current $I_0$, while the gate voltages $v_{gs}$ of all JFETs 10 remain constant at $V_{gs}(I_0)$, as seen in FIG. 3. All JFETs are still in the saturation region. Analytical calculations predict $V_{gs}(I_0)$ as:

$$V_{gs}(I_0) = I_0/g_m + V_{th}. \quad (V)$$

The gate currents flow entirely through the gate-to-drain capacitances of the JFETs 10, and there is no current through the gate-to-source capacitances. While the JFETs 10 are operating in saturation, the discharge of the gate-to-drain capacitances reduces the drain voltages $v_{ds}$ linearly, as seen in FIG. 3 (curves 30, 32, 34, 36).

The well-known condition for JFET operation in the triode region is that the gate voltage is greater than the sum of the drain voltage and the threshold voltage. The time $t_2$ occurs when $J_4$ enters the triode region, i.e., when $v_{ds4}=v_{gs4}-V_{th}$. At that point, the $J_4$ gate voltage starts to rise, as shown by curve 38 in FIG. 3. Similar behavior is seen in $J_3$ (curve 40), $J_2$ (curve 42), and $J_1$ (curve 26) as they enter the triode region at times $t_3$, $t_4$, and $t_5$, respectively.

Interval 3, t>$t_5$. All JFETs 10 are operating in the triode region. The gate currents decay to zero, and the gate voltages 26, 38, 40, 42 decay to $V_{G+}$. At that point, the JFET leg 12 is fully ON.

Figure 4:
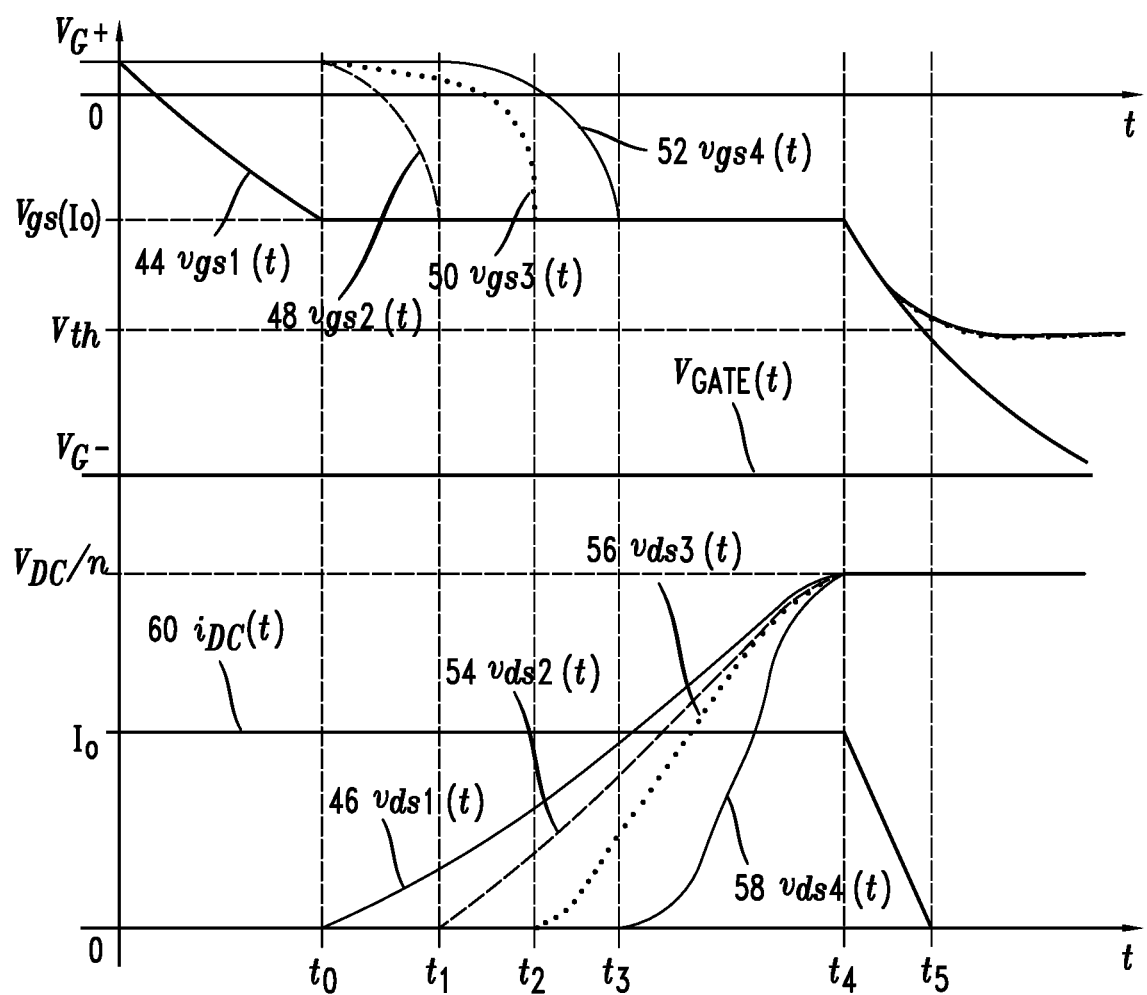
FIG. 4 is a graph of the predicted waveforms of the respective gate-to-source and drain-to-source voltages of the respective JFETs during the turn-OFF process of an illustrative switch circuit. The predicted waveform of the current $i_{DC}$ in the switch circuit is also shown.

Turn-OFF Process. Our modeling study also predicted the waveforms during the turn-OFF process. The results are shown in FIG. 4, to which attention will be drawn in the following discussion.

Interval 0, from t=0 to t=$t_0$. As the initial state, we take a steady state in which the JFET leg 12 is fully ON and is conducting the load current $I_0$, and in which $v_{ds} \approx 0$, and $v_{gs} \sim V_{G+}$ for all JFETs 10. The turn-OFF transition starts when a negative voltage $V_{G-}$ lower than the threshold voltage $V_{th}$ is applied between the Gate and Source 14 terminals of the switch circuit.

The response of the $J_1$ gate voltage, as predicted by analytical calculations, is:

$$v_{gs1} = V_{G-} + (V_{G+} - V_{G-}) \cdot \exp(-t/R_{g1}(C_{gs1} + C_{gd1})). \quad (VI)$$

As shown in FIG. 4, $v_{gs1}$ (curve 44) decays exponentially until, at time $t_0$, a constant voltage level equal to $V_{gs}(I_0)$ is reached and $J_1$ enters the saturation region. Analytical calculations predict a value for $t_0$ given by:

$$t_0 = R_{g1}(C_{gs1} + C_{gd1}) \ln[(V_{G+} - V_{G-})/((I_0/g_m) + V_{th} - V_{G-})]. \quad (VII)$$

Interval 1, from t=$t_0$ to t=$t_1$. $J_1$ begins to operate in the saturation region while the other JFETs 10 are still operating in the triode region. As the $J_1$ drain voltage $v_{ds1}$ (curve 46) starts to rise at to, the gate voltages of $J_2$, $J_3$ and $J_4$ (curves 48, 50, and 52, respectively) start to decrease, as shown in FIG. 4. By analytical calculation, we predict a linear rise in the $J_1$ drain voltage, according to:

$$v_{ds1} = [(I_0/g_m + V_{th} - V_{G-})/R_{g1}C_{dg1}](t - t_0). \quad (VIII)$$

Interval 1 ends at time $t_1$, where $v_{gs2}$ has decayed to the value $V_{gs}(I_0)$, and $v_{ds2}$ (curve 54) starts to rise.

Interval 2, from t=$t_1$ to t=$t_3$. The operation during the time intervals [$t_1$-$t_2$] and [$t_2$-$t_3$] is analogous to the operation during the interval [$t_0$-$t_1$]. As shown in FIG. 4, $t_2$ and $t_3$ are the time instants when the gate voltage of $J_3$ (curve 50) and the gate voltage of $J_4$ (curve 52) respectively decay to $V_{gs}(I_0)$.

The $J_3$ drain voltage (curve 56) rises to $V_{DC}/4$ at time $t_2$, and the $J_4$ drain voltage (curve 58) rises to $V_{DC}/4$ at time $t_3$.

Interval 3, from t=$t_3$ to t=$t_4$. In this interval, all JFETs 10 are operating in saturation with their gate voltages clamped to $V_{gs}(I_0)$. This interval ends when the voltage across Drain 16 and Source 14 terminals equals $V_{DC}$. Analytical calculation yields the following expression for $t_4$:

$$t_4 = [(R_{g1}C_{gd1}V_{DC}/n)/((I_0/g_m) + V_{th} - V_{G-})] + t_0. \quad (IX)$$

Interval 4, for t>$t_4$. As noted above, our model assumes there is a free-wheeling diode connected across the switch circuit. In Interval 4, the free-wheeling diode conducts, clamping the voltage across the switch circuit at $V_{DC}$. When the gate voltages 44, 48, 50, 52 of the JFETs 10 reach the threshold voltage $V_{th}$, the current $i_{DC}$ (curve 60) in the switch circuit falls to zero. The gate voltages 48, 50, 52 of all JFETs 10 remain close to $V_{th}$, except for $v_{gs1}$ (curve 44), which continues to decay to $V_{G-}$.

Steady-State Operation. Resistors $R_1$ to $R_{n+1}$ form the resistive balancing network of the switch circuit of FIG. 1. The main objective for this network is to maintain a stable and evenly distributed voltage across each JFET 10, particularly during the OFF state. Voltage mismatches can occur in serial connections of devices, due to parasitic resistances and parasitic capacitances that cannot be completely controlled for during device manufacture. Additionally, the resistive balancing network between gate terminals of the cascaded JFETs 10 is subject to further voltage imbalance due to gate leakage currents.

For example, the leakage currents in the resistors of FIG. 1 contribute to a total current in resistor $R_1$ given by:

$$i_{R1} = i_{R(\frac{n}{2}-1)} - \sum_{k'=2}^{n} i_{gk'}, \quad (X)$$

with the summation taken only over even values of k'.

The sensitivity $S_{i_{gk}}^{i_{R1}}$ of $i_{R1}$ with respect to the $J_k$ gate leakage current can be calculated according to the following formula:

$$S_{i_{gk}}^{i_{R1}} = -\frac{i_{gk}}{i_{R(\frac{n}{2}-1)} - \sum_{k'=2}^{n} i_{gk'}} \text{ if } k \text{ even,} \quad (XI)$$

$$S_{i_{gk}}^{i_{R1}} = 0 \text{ if } k \text{ odd,}$$

with the summation taken only over even values of k'.

It will be understood from the above formula that the sensitivity of the bottom resistor is affected by the gate currents from the upper JFETs 10, and that increasing the total number of JFETs 10 tends to increase the sensitivity. However, the above formula also suggests that the sensitivity tends to be low when the leakage currents are low and when the currents through the balancing resistors are high.

It should also be noted that here, the summation is taken only over the gate currents of the even-numbered JFETs 10. This leads to a relatively low value for the sensitivity. This limited summation is a consequence of the, e.g., dual-leg topology, in which the odd-numbered JFETs 10 do not contribute to the sensitivity. This is in contrast to conventional resistive balancing networks that use only a single resistor leg.

Circuit Breaker Architecture

Figure 5:
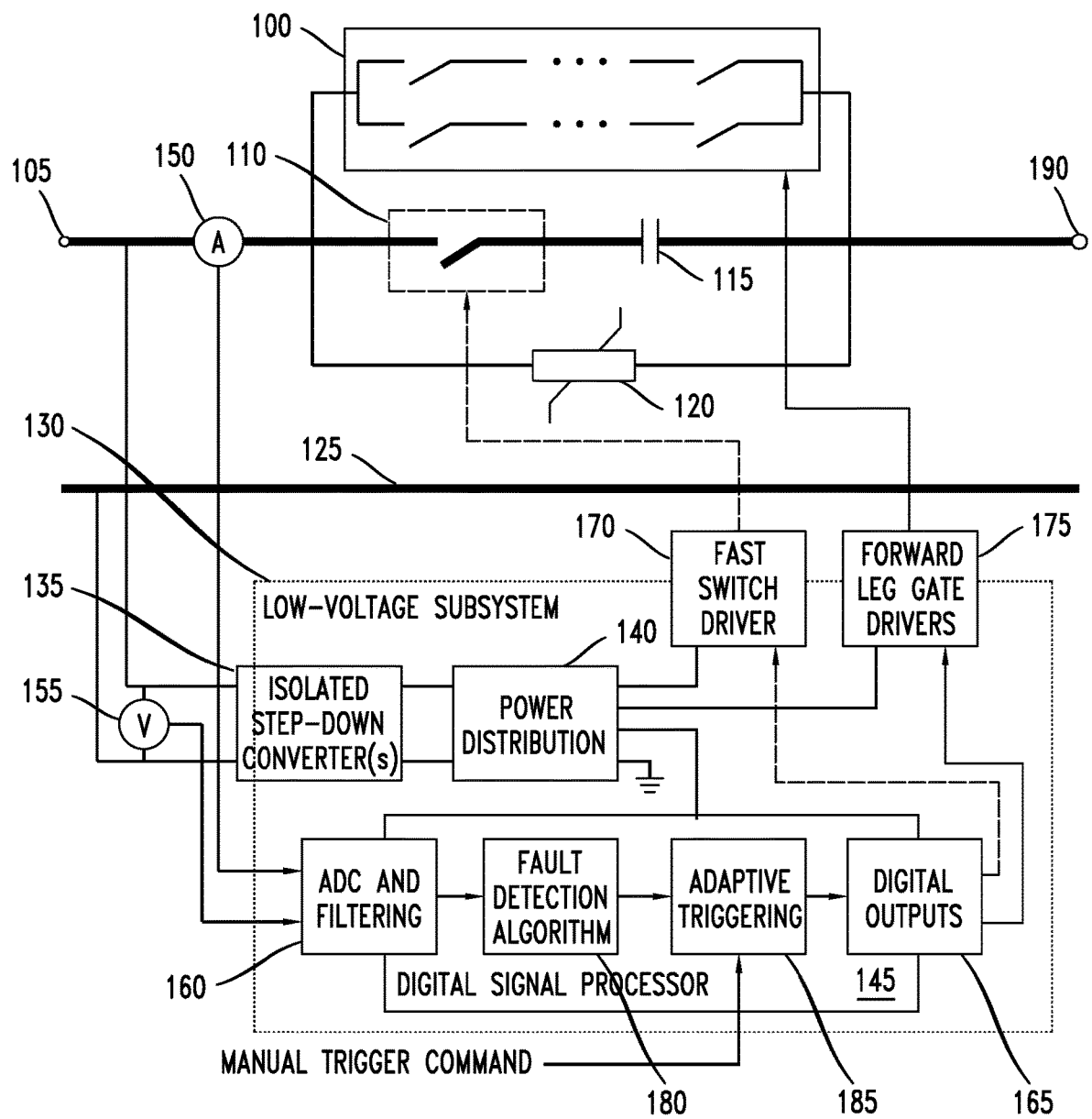
FIG. 5 is a block diagram illustrating an architecture for a breaker circuit incorporating the switch circuit described here, in an example embodiment.

For purposes of illustration, FIG. 5 provides a functional block diagram of an example architecture for a high-voltage breaker circuit that incorporates the switch circuit of the present disclosure. As shown in FIG. 5, switch circuit 100 is connected in series on high-voltage bus 105. Fast switch 110 and energy-absorbing capacitor 115 are connected in parallel with the switch circuit 100 to absorb and dissipate power spikes when the switch circuit 100 changes state. A snubber circuit 120 is connected in parallel with the switch circuit 100 for protection against overvoltages. The energy-dissipating element in the snubber circuit 120 is shown here as a varistor, but alternative components could be used instead, such as a free-wheeling diode as discussed above. The load, which is not shown in FIG. 5, would be connected between the high-voltage bus 105 and the ground bus 125.

Control for the breaker circuit is provided by low-voltage subsystem 130. As shown, an isolated step-down converter 135 and a power-distribution circuit 140 tap power from the high-voltage bus 105, step it down to a low voltage, and distribute it within the low-voltage subsystem 130 to components including digital signal processor (DSP) 145. The inputs to the DSP 145 include signals from current monitor 150 and voltage monitor 155, and the outputs include digital control signals for the switch circuit 100 and for fast switch 110. As shown in FIG. 5, the input to the DSP 145 is conditioned by module 160, which performs analog-to-digital conversion and filtering. The output is conditioned by digital output module 165, which generates the signals that trigger driver circuit 170 for the fast switch 110 and forward leg gate-driver circuit 175 for the switch circuit 100. The forward leg gate-driver circuit 175, with its controls and power supply, is an example of the ancillary circuit mentioned above for maintaining the JFETs 10 of the switch circuit 100 in their OFF state when desired.

The DSP 145 implements fault-detection algorithm 180 to determine, in response to the current and voltage signals, whether a fault has occurred. Adaptive triggering module 185 within the DSP 145 responds to a fault detection by activating the trigger signals.

In an example scenario, detection of a fault condition is followed by generation of a trigger signal that turns the JFETs 10 of the switch circuit 100 OFF. This is followed by a trigger signal that closes the fast switch 110 so that excess power is diverted into the snubber circuit 120 and dissipated there.

EXAMPLE

We constructed a 1.2 kV/10 A prototype switch circuit with the topology of FIG. 2. The design parameters are listed in Table 2.

The SiC JFETs 10 selected for our prototype are UJ3N120035K3S JFETs from United SiC. These devices can be driven with voltages within the range $-20V<v_{gs}<3V$. We selected driving voltages of $V_{G+}=1V$ for turning ON, and $V_{G-}=-18V$ for turning OFF. For a gate driver, IC, we selected the UCC5390ECQDWVRQ1 integrated circuit from Texas Instruments. This device provided 10 A of source and sink driving current capability.

For testing, we used a Magnapower TSD2000-15 dc voltage source, which is rated at 2 kV, 15 A and 30 kW, and a Chroma 63224A-1200-960 high-power dc electronic load, which is rated at 1.2 kV, 960 A and 24 kW. An auxiliary Keithley 2280S-32-6 power supply provided power to the gate-driver circuit. A BK Precision 4080B function generator was used to provide a trigger gating signal. A Tektronix 5-Series 8-Channels, 350 MHz oscilloscope was used for experimental readout.

The values of the balancing resistors $R_1$ to $R_5$ were selected to maintain a stable dc voltage across the resistor left and right legs 22, 24. The steady-state voltages across the resistors, as can be inferred from FIG. 2, are:

$$v_{R1} = v_{g2}, \quad \text{(XII)}$$

$$v_{R2} = v_{g4} - v_{g2}, \quad \text{(XIII)}$$

$$v_{R3} = V_{Drain} - v_{g4}, \quad \text{(XIV)}$$

$$v_{R4} = v_{g3}, \quad \text{(XV)}$$

$$v_{R5} = V_{Drain} - v_{g3}. \quad \text{(XVI)}$$

The gate voltages are calculated, assuming that the resistor left and right legs 22, 24 is perfectly balanced, as:

$$v_{gi}=[(i-1)/n]+V_{th}, 1\leq i\leq n. \quad \text{(XVII)}$$

The JFET threshold voltage $V_{th}$ in this example is $-11.5V$.

Based on the desired maximum power dissipation $P_{dmax}$ of the passive network, the currents through the bottom resistors $R_1$ and $R_4$ were arbitrarily selected as:

$$i_{R1} = i_{R4} = I_R \cong p_{dmax}/\sum_{i=1}^{n} v_{R1}. \quad \text{(XVIII)}$$

Then, by considering the gate leakage currents $i_{g2}$-$i_{g4}$, the currents though resistors $R_2$, $R_3$ and $R_5$ are obtained as:

$$i_{R2} = I_R - i_{g2}. \quad \text{(XIX)}$$

$$i_{R3} = I_R - i_{g2} - i_{g4}. \quad \text{(XX)}$$

$$i_{R5} = I_R - i_{g3}. \quad \text{(XXI)}$$

Then, the balancing resistors can be calculated as:

$$Ri=vR_i/iR_i, 1\leq i\leq n. \quad \text{(XXII)}$$

The capacitors $C_1$ to $C_4$ improve the dynamic performance and prevent voltage spikes across the drain-to-source terminals of the JFETs 10. Published formulas can be used to estimate the capacitor values; the estimated values can then be adjusted using simulation tools.

Figure 6:
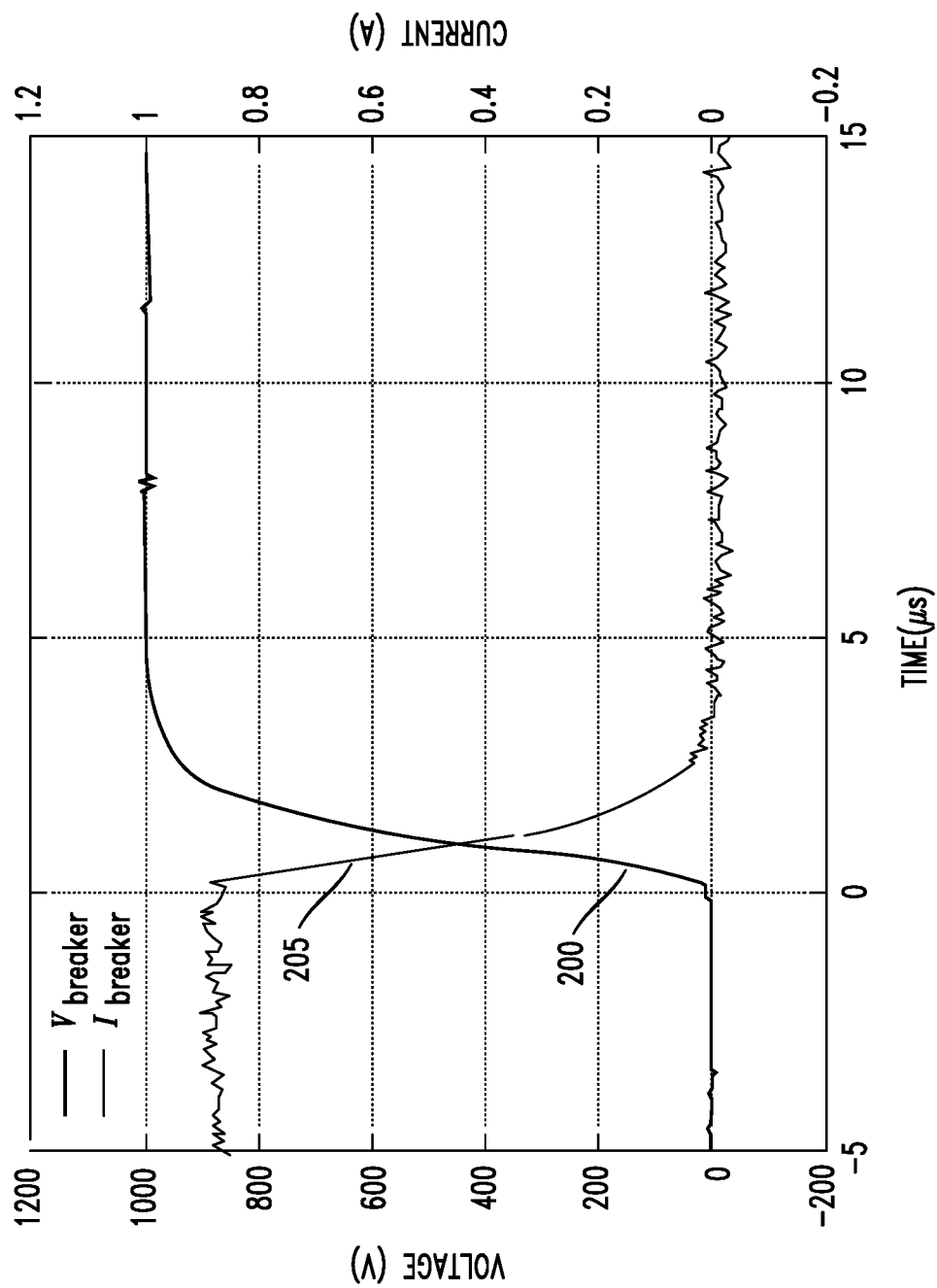
FIG. 6 is a graph of the experimentally measured voltage versus time across a prototype switch circuit ("$V_{breaker}$") and the experimentally measured current versus time through the prototype switch circuit during a turn-OFF transition.

FIG. 6 is a graph of the voltage 200 across the switch circuit ("$V_{breaker}$") and the current 205 through the switch circuit ("$I_{breaker}$") versus time during a turn-OFF transition of our prototype when under test. It can be seen that the turn-OFF transition takes about 2 µs.

Figure 7:
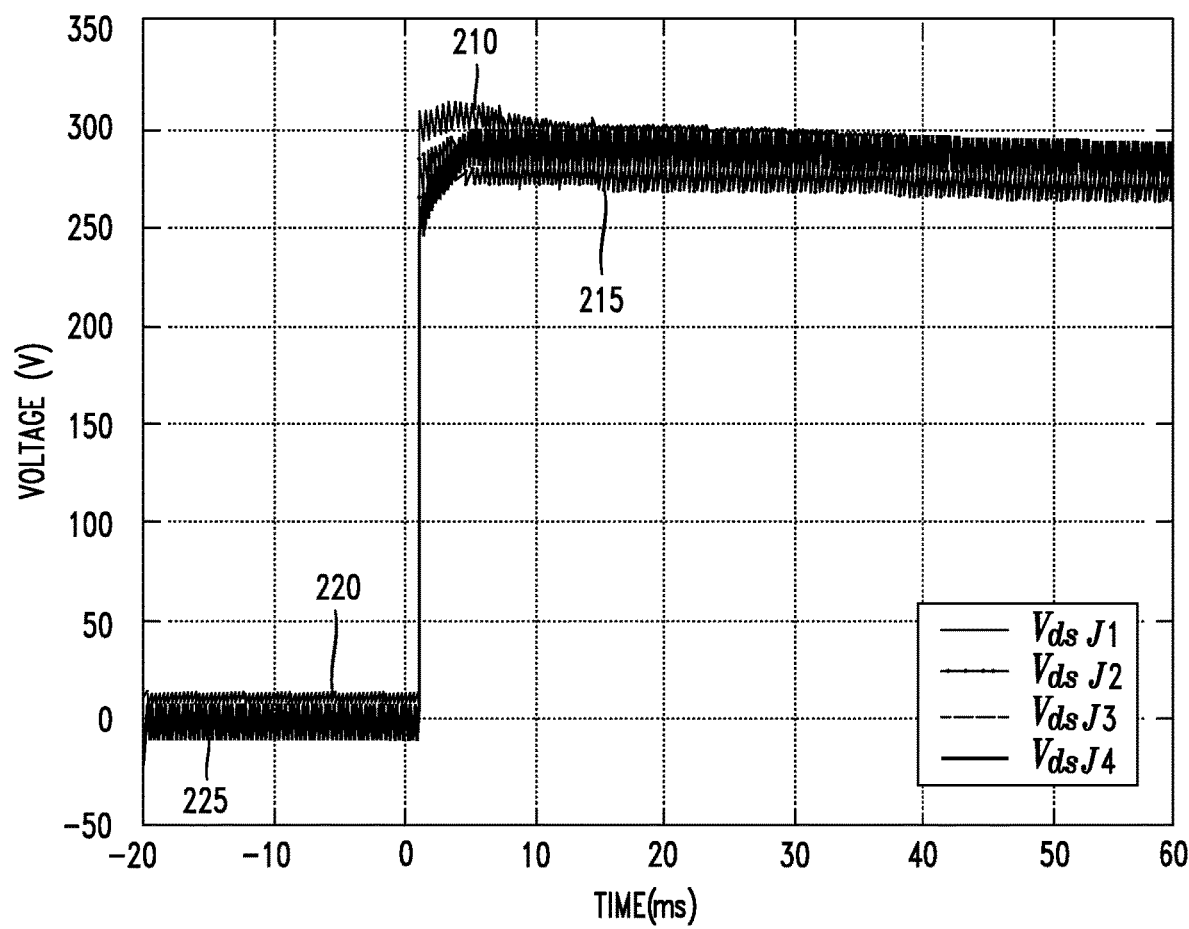
FIG. 7 is a composite graph of the experimentally measured drain-to-source voltages versus time of the respective JFETs $J_1$ to $J_4$ of a prototype switch circuit.
Figure 8:
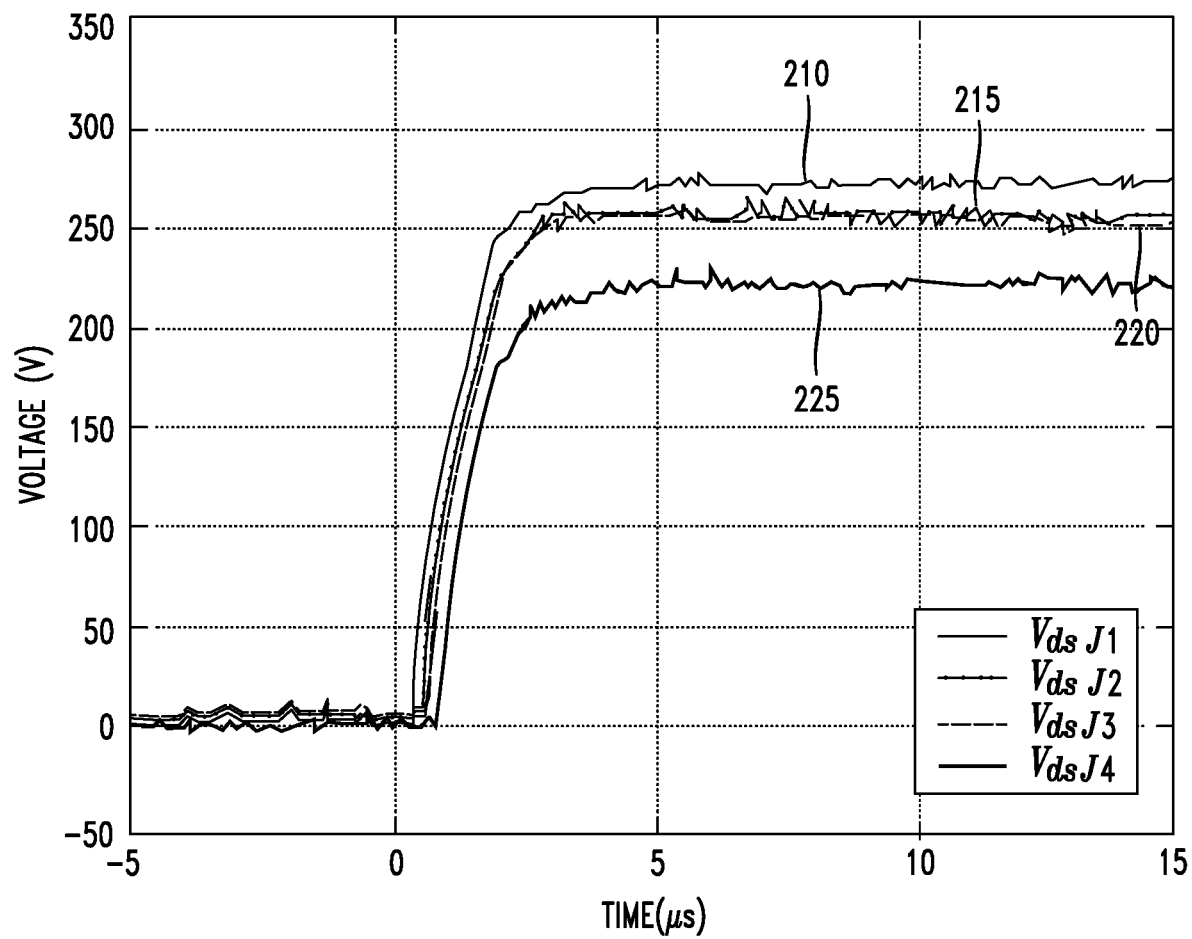
FIG. 8 is a portion of the preceding figure, showing the drain-to-source voltages over an expanded timescale.

FIG. 7 is a composite graph of the drain-to-source voltages of the respective JFETs $J_1$ (curve 210), $J_2$ (curve 215), $J_3$ (curve 220), and $J_4$ (curve 225) as functions of time over an 80-ms timescale. The graph indicates that the balancing network operated successfully. FIG. 8 is a portion of FIG. 7, showing the drain-to-source voltages over an expanded timescale spanning 20 µs. No transient voltage spikes are seen in FIG. 8. This indicates that the capacitance network was well balanced.

Figure 9:
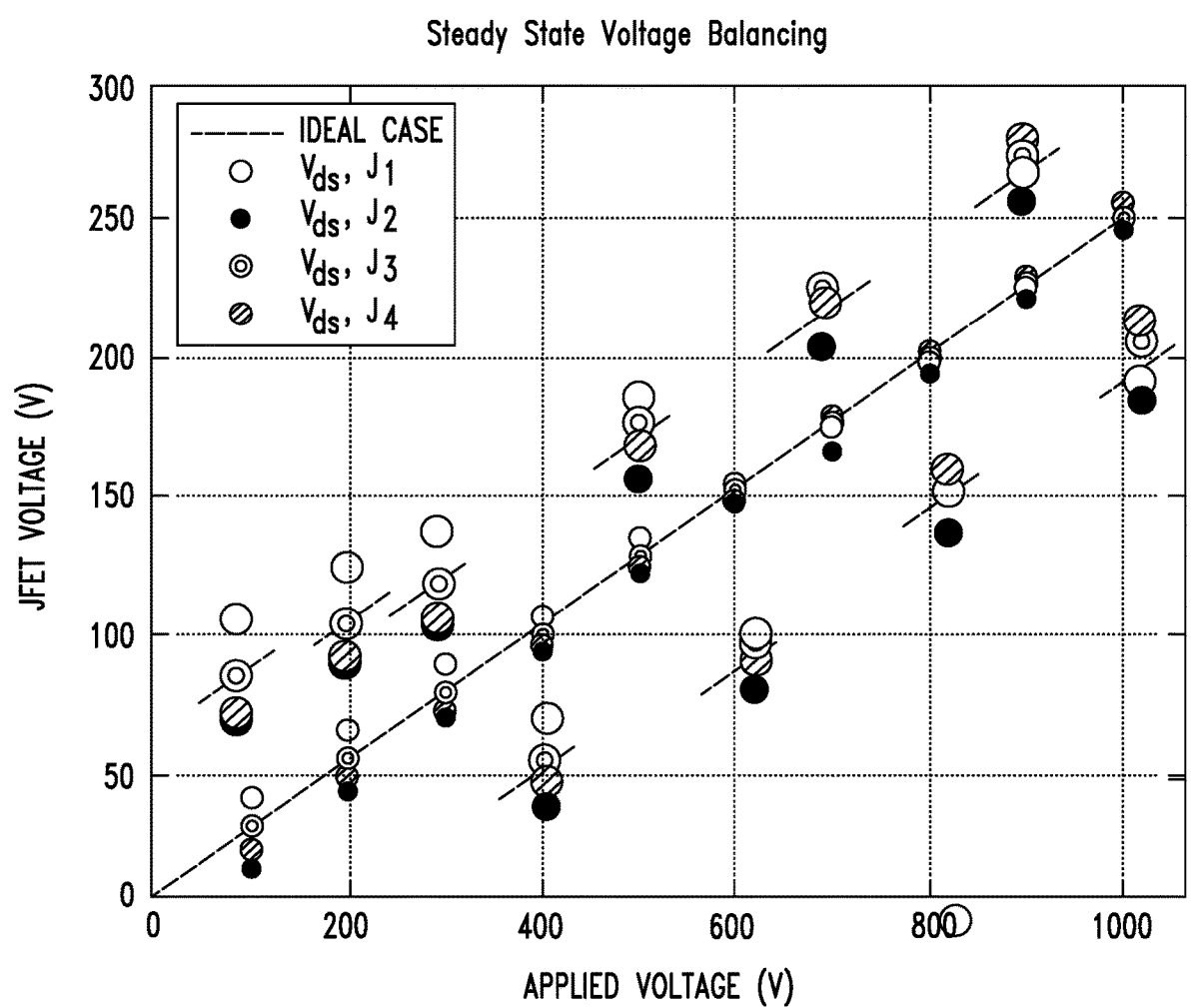
FIG. 9 is a graph that illustrates the distribution of steady-state drain-to-source voltages of the respective JFETs in a prototype switch circuit at ten different applied voltages.

FIG. 9 illustrates the distribution of steady-state drain-to-source voltages over the JFET leg 12 when the prototype was subjected to different applied voltages. At each of ten applied voltages ranging from 100V to 1000V, the respective steady-state drain-to-source voltage is plotted for each of the four JFETs 10 as a cluster of data points. Because the data points are difficult to distinguish on the scale of the plot, a magnified view of each cluster is also provided. It will be evident from FIG. 9 that there is only a small divergence in voltage among the four JFETs 10. This indicates that the dc bus voltage is divided evenly in all devices, even at relatively low voltages.

TABLE 2

1.2 kV/10 kV SiC JFET Super Cascode Parameters

| Balancing Resistors | |
|---|---|
| $R_1$ | 288.5 kΩ |
| $R_2$ | 628.81 kΩ |
| $R_3$ | 341 kΩ |
| $R_4$ | 288.5 kΩ |
| $R_5$ | 638.7 kΩ |
| Balancing Capacitors | |
| $C_1$ | 2.9 nF |
| $C_2$ | 2.35 nF |
| $C_3$ | 1.8 nF |
| $C_4$ | 1.25 nF |
| Gate Resistors | |
| $R_{g1}$, $R_{g2}$, $R_{g3}$, $R_{g4}$ | 15 Ω |
| SiC JFETs | |
| $J_1$, $J_2$, $J_3$, $J_4$ | United SiC-UJ3N120035K3S 1200 V/46 A @ 100° C. |
| Avalanche Diodes | |
| $D_1$, $D_2$, $D_3$ | Vishay-BYG20J-E3/TR 600 V/1.5 A |

Optically Switched Circuit Breaker

A prototype circuit breaker based on the circuit of FIG. 5 included a photoconductive semiconductor switch (PCSS) serving as fast switch 110 to perform optical triggering. The PCSS composition in the prototype was gallium nitride (GaN). However, other direct-bandgap, III-V compositions may also be suitable, particularly aluminum gallium nitride (AlGaN) compositions.

Turning back to FIG. 5, we repeat that switch circuit 100 is connected in series on high-voltage bus 105. Fast switch 110 and energy-absorbing capacitor 115 are connected in parallel with the switch circuit 100 to absorb and dissipate power spikes when the switch circuit 100 changes state. As such, the subcircuit containing fast switch 110 and energy-absorbing capacitor 115 constitutes a switchable bypass leg.

As explained above, the transistors in example embodiments of switch circuit 100 are JFETS, for example, silicon carbide or other wide-bandgap material JFETs. However, they may alternatively be transistors of other kinds, such as GaN transistors, for example, high electron mobility transistors (HEMTs), in one non-limiting example. In the example described below, the switch circuit 100 will be described as comprising cascaded JFETs. However, this choice of transistor type should be understood only as a non-limiting example.

A snubber circuit 120 is connected in parallel with the switch circuit 100 for protection against overvoltages. Although the energy-dissipating element in the snubber circuit 120 is shown in FIG. 5 as a varistor, it could be substituted by, or combined with, another type of energy-dissipating element, such as a free-wheeling diode. The load, which is not shown in FIG. 5, would be connected between the ground bus 125 and the output 190 of the parallel combination of the switch circuit 100, the switchable bypass leg, and the snubber circuit 120.

The prototype was thus a circuit breaker with an optically activated switchable bypass leg. In experimental tests, a prototype designed for a voltage of 1.2-kV was evaluated. In the tests, the prototype was positioned between a DC power supply and a passive load. The power supply, which could source up to 30 kW at 2 kV, remained ON throughout the tests. The circuit breaker was initially in the ON state, i.e., conducting current to the load through the normally-ON JFET path. Current and voltage waveforms were recorded during a turn-OFF transient, in which the breaker transitions to a high impedance state and breaks the DC current flowing to the load. An objective of these experiments was to evaluate the coordinated behavior of the normally-ON (JFET) and normally-OFF (PCSS) subcircuits within the circuit breaker. This behavior is controlled by the timing of the control signals sent to the PCSS optical driver and to the JFET-circuit gate driver.

In the prototype, shunt capacitor 115 had a capacitance value of 1 μF. The PCSS was actuated with 1-2 mJ of optical energy from a 532-nm pulsed laser. Experimental trials demonstrated that full breaking of a faulty circuit could be achieved in less than 1 ms, and with suitable choices of components, we believe that the full breaking of a faulty circuit can be achieved in 0.5 ms or even less. We believe that in embodiments, circuit breakers of the kind described here will be useful for switching voltages up to 1 kV and even greater voltages.

Figure 10:
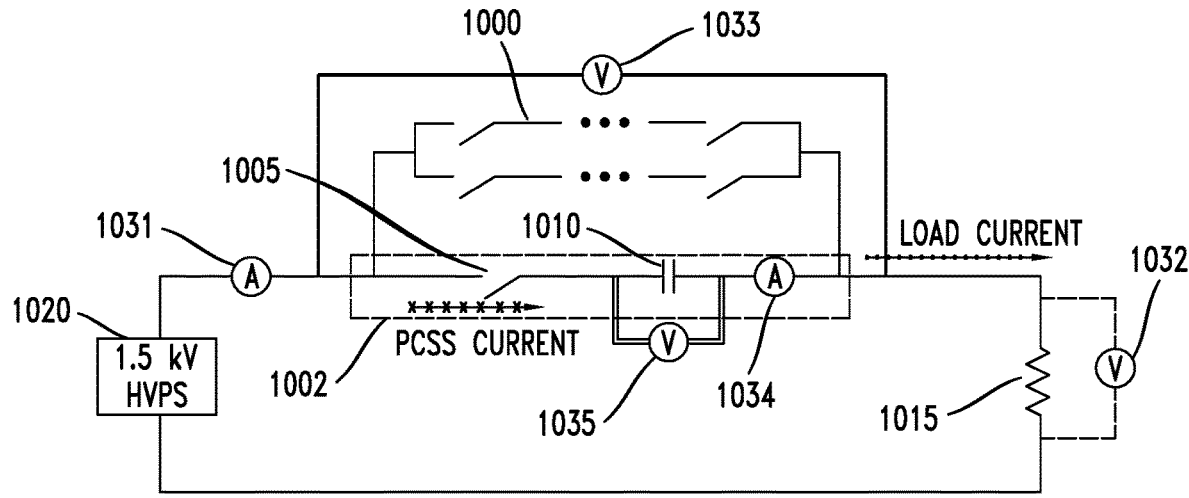
FIG. 10 is a simplified representation of a circuit breaker, similar to the circuit of FIG. 5, expressly including a photoconductive semiconductor switch (PCSS).
Figure 11:
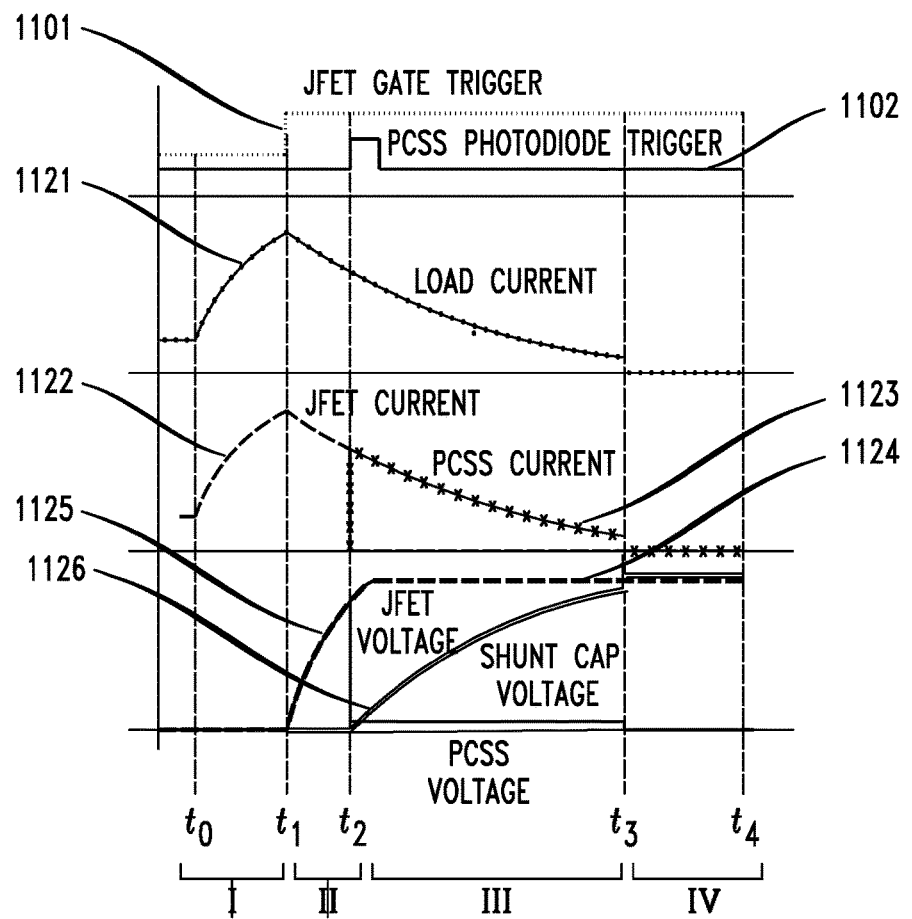
FIG. 11 is a conceptualized representation, in a series of idealized plots, of the time-dependent behavior of voltages and currents that characterize the desired switching behavior of the circuit breaker of FIG. 10.

FIGS. 10 and 11 illustrate the measurement nodes and the idealized, time-dependent behavior of the optically triggered circuit breaker, respectively. FIG. 10 is a simplified version of FIG. 5, including a JFET switch circuit 1000, a switchable bypass leg 1002 including PCSS 1005 and shunt capacitor 1010, a load (represented with a resistor symbol) 1015, and a high voltage power supply (HVPS) 1020.

Five measurement nodes are shown in FIG. 10, to indicate where measurements could be taken in order to produce data such as the traces shown in FIG. 11. The nodes included in FIG. 10 are: a node 1031 for the current through the load 1015 (load current), a node 1032 for the voltage across the load 1015, a node 1033 for the voltage across the JFET switch circuit 1000 (JFET voltage), a node 1034 for the current through the PCSS 1005 (PCSS current), and a node 1035 for the voltage across the shunt capacitor 1010 (shunt capacitor voltage). Nodes for measuring the voltage across the PCSS 1005 (PCSS voltage) and the current through the JFET switch circuit 1000 (JFET current) are not shown in FIG. 10, although traces of the PCSS voltage and the JFET current versus time are included in FIG. 11.

As is known in the art, photoconductive semiconductor switches generally have a linear mode of operation, in which current is maintained only during optical stimulation. It is also known that some photoconductive semiconductor switches also exhibit a high-gain mode of operation above certain voltage thresholds. Operation in the high-gain mode may be advantageous, because it generally corresponds to a higher number of carriers and a commensurately higher current density, relative to linear operation. Moreover, the high-gain mode may exhibit a potentially advantageous behavior referred to as lock-on. Lock-on is a feature of the high-gain mode, in which current may be maintained after the optical stimulation ceases, provided the voltage remains above a pertinent threshold. Such operation is sometimes referred to as operation in lock-on mode.

The PCSS in the circuit breaker described here can be usefully operated in linear mode. It should thus be understood that operation in high-gain mode, or operation in lock-on mode, is not essential. However, because it offers the potential for a relatively high current density that can be maintained for a time absent optical stimulation, lock-on behavior of the PCSS can be advantageous.

Accordingly, the activation of the PCSS in one possible mode of operating the circuit breaker, is precisely timed to achieve lock-on of the PCSS and to reroute current from the JFET circuit through the switchable bypass leg while the PCSS is in the lock-on mode of operation. As is known in the art, lock-on is a feature of the high-gain mode of PCSS operation.

A critical control parameter governing circuit timing for lock-on operation in embodiments of our circuit breaker is the delay between the JFET trigger at a time referred to below as $t_1$, and the PCSS firing at a time referred to below as $t_2$. Lock-on behavior in the PCSS requires some minimum voltage across the device at the time of activation. Since the PCSS is not conducting before it fires, the PCSS voltage is equal to the voltage across the JFET circuit, which begins to rise after the gate driver turn-OFF signal is issued. If the PCSS fires too early, the voltage across the device will not have risen sufficiently to achieve lock-on. If the PCSS fires too late, the JFET circuit turn-OFF will have completed while bearing the full fault current, causing significant thermal stress to the normally-ON path.

Hence, the overall timing in the operation of the breaker circuit must be tailored properly in order to achieve the intended operative behavior in lock-on. In particular, the delay time of the control circuitry and the delay time of the optical trigger are important factors to be considered, because they can affect the time interval between initial recognition of a fault condition and the triggering of the optical signal on the PCSS.

FIG. 11 is a conceptualized representation, in the series of idealized plots 1101-1106, of the time-dependent behavior of voltages and currents that characterize the desired switching behavior of the circuit breaker for lock-on operation. A JFET gate trigger signal is shown in trace 1101, and a PCSS photodiode trigger signal is shown in trace 1102. Traces 1121-1126 show, respectively, the responses to the trigger signals in the load current, the JFET current, the PCSS current, the JFET voltage, the PCSS voltage, and the shunt capacitor voltage.

As explained below, significant events occur at times $t_0$, $t_1$, $t_2$, $t_3$, and $t_4$, which are indicated in FIG. 11. Also indicated in FIG. 11 are a time interval I between $t_0$ and $t_1$, a time interval II between $t_1$ and $t_2$, a time interval III between $t_2$ and $t_3$, and a time interval IV between $t_3$ and $t_4$. Each of these time intervals is discussed below.

In the scenario illustrated in FIG. 11, JFET switch circuit 1000 is initially ON, and the circuit is initially in a steady-state condition.

Interval I. The fault occurs at time $t_0$, causing the current through the normally-ON path to rise. Turning to FIG. 11, it is seen, accordingly, that load current trace 1121 rises from $t_0$ until $t_1$. At $t_1$, the fault current is detected, and in response, the JFET-circuit gate driver is triggered, forcing the cascaded JFETs to begin transitioning to the OFF state. The voltage across the normally-ON path begins to rise. The JFET trigger signal is shown in FIG. 11 as JFET gate trigger trace 1101. Turn-OFF procedures suitable for this purpose are described above.

Interval II. After turn-OFF of JFET switch circuit 1000 at $t_1$, the JFET voltage continues to rise, as seen in trace 1124. The JFET switch circuit 1000 turn-OFF also causes the JFET current to start to decrease, as seen in trace 1122. As the PCSS 1005 has not yet been switched ON, the load current trace 1121 is similar to the JFET current trace 1122 during this interval.

The PCSS voltage is substantially the same as the JFET voltage during interval II. That is important for the operation of the circuit breaker, because when the PCSS 1005 is triggered at time $t_2$, it must be triggered in high-gain mode. In order for that to happen, the voltage across the PCSS 1005 must be at or above a threshold.

It is also noteworthy in this regard that excessive jitter in the light source (not illustrated in FIG. 10) that triggers the PCSS 1005 can cause the PCSS 1005 to trigger before it has reached high-gain mode. If that happened, it would degrade the performance of the circuit breaker. To avoid such an occurrence, the amount of jitter in the light source is preferably a small fraction of the time interval between the triggering of the JFET switch circuit 1000 and the triggering of the PCSS 1005. For example, jitter of less than 100 ns would be desirable, and jitter of less than 10 ns would be preferred.

It will be understood from the above discussion that the interval between $t_1$, when the JFET switch circuit 1000 is triggered, and $t_2$, when the PCSS 1005 is triggered, must be adapted to assure sufficient PCSS voltage to initiate high-gain mode. An additional factor in determining this interval is heating of the JFETs in the JFET switch circuit 1000 by the fault current during interval II. The length of the interval must be short enough to avoid heating the JFETs beyond their maximum tolerable temperature.

Interval III. The PCSS 1005 is triggered at $t_2$, as seen in trace 1102. This event occurs during the turn-OFF transient of the JFET switch circuit 1000, while there is sufficient voltage across the PCSS 1005 to initiate high-gain mode. The PCSS 1005 becomes conductive, as seen in PCSS current trace 1123. While in high-gain mode, the PCSS 1005 diverts fault current from the JFET switch circuit 1000 to charge the shunt capacitor 1010. Accordingly, JFET current trace 1122 shows the JFET current dropping to a very low value at $t_2$, and the shunt capacitor voltage trace 1126 shows shunt capacitor 1010 charging with an RC time constant, beginning at $t_2$.

The remaining voltage on the PCSS during time interval III is the lock-on voltage, which those skilled in the art will recognize as a signature of the high-gain mode of PCSS operation. The lock-on voltage keeps the PCSS in the ON-state, in which current can still flow despite the cessation of optical stimulation. The voltage across the PCSS will fall as the capacitor charges and the system current is shunted through the PCSS to energy dispersing elements.

Interval IV. The PCSS voltage has maintained a low, but non-zero, value during interval III. At $t_3$, however, the PCSS voltage falls below the value needed to maintain the high-gain mode. The PCSS 1005 turns OFF, breaking the PCSS current and the load current.

This threshold behavior of the PCSS 1005 is an example of lock-on behavior, which, as noted, is typically seen in connection with the high-gain mode in optically switched III-V semiconductors. As pointed out above, a PCSS 1005 may be made, for example, from gallium nitride (GaN). By way of illustration, a field of about 6 kV/cm is needed to trigger lock-on in GaN, and a field of about 4-6 kV/cm is needed to sustain it. When the field drops below the sustaining value, the conductivity drops to a very low value.

The triggering of the circuit breaker has several functional components, including detecting an overcurrent condition indicative of a fault, deciding when the circuit breaker should open and interrupt the fault current, and opening the circuit breaker. Preferably, the circuit breaker should open only in the event of a "hard" fault, i.e., an abnormal condition of sufficient duration to be of concern, and should not open in response to harmless transient overcurrents and the like. Criteria for identifying a hard fault condition are discussed below.

A load current sensor detects the overcurrent condition by measuring the load current to the load 1015. The load current can be measured by direct or by indirect sensing techniques. Examples of directly sensing hardware include Hall effect sensors and shunt resistors, both of which are known for DC circuit breaker applications. Shunt resistor sensing provides higher bandwidth, but the need for sensor isolation may pose difficulties at very high voltages. Hall effect sensors have lower bandwidth, but because they have inherent galvanic isolation, they may be preferable at high voltages, such as 10 kV and above.

Indirect sensing may be by any of various techniques, such as measuring the voltage across an internal, series-connected inductor or semiconductor device, measuring changes in gate current due to large line current transients, and detecting changes in the intensity of light emitted by a silicon carbide JFET die due to high device current.

A component or system for implementing triggering logic takes the sensed circuit breaker current as an input, and it provides, as an output, a signal or set of signals to open the circuit breaker. An important feature of the triggering system is the timing of turn-OFF pulses so that the PCSS and the JFET switch circuit transitions are properly sequenced. In example implementations, the triggering logic is implemented in a digital controller, such as DSP 145 of FIG. 5, operating with, e.g., 1-μs cycle time. The use of a digital controller is advantageous, not least, because in addition to conventional control functions for circuit breakers, the digital controller must compute the timing of the PCSS and JFET switch circuit triggers, which is complex because it depends on the magnitude of the fault current. It is also beneficial that the digital controller can implement a computational approach for rejecting nuisance trips.

In one aspect, the triggering scheme performs threshold comparisons, similar to how time-current characteristic curves such as current-squared-time (I2t) curves are used with traditional electromechanical devices for circuit protection. The I2t curves provide thresholds against which current and thermal energy computations can be compared.

More specifically, the value of the parameter I2t is proportional to the amount of electrothermal energy that is heating the overcurrent device. When this value exceeds some threshold, the circuit breaker actuates. The energy threshold is fixed, and for a given fixed energy threshold W and a certain current value i, there is a corresponding time value t which defines the amount of time that current can be permitted to flow before the circuit breaker will trip.

Figure 12:
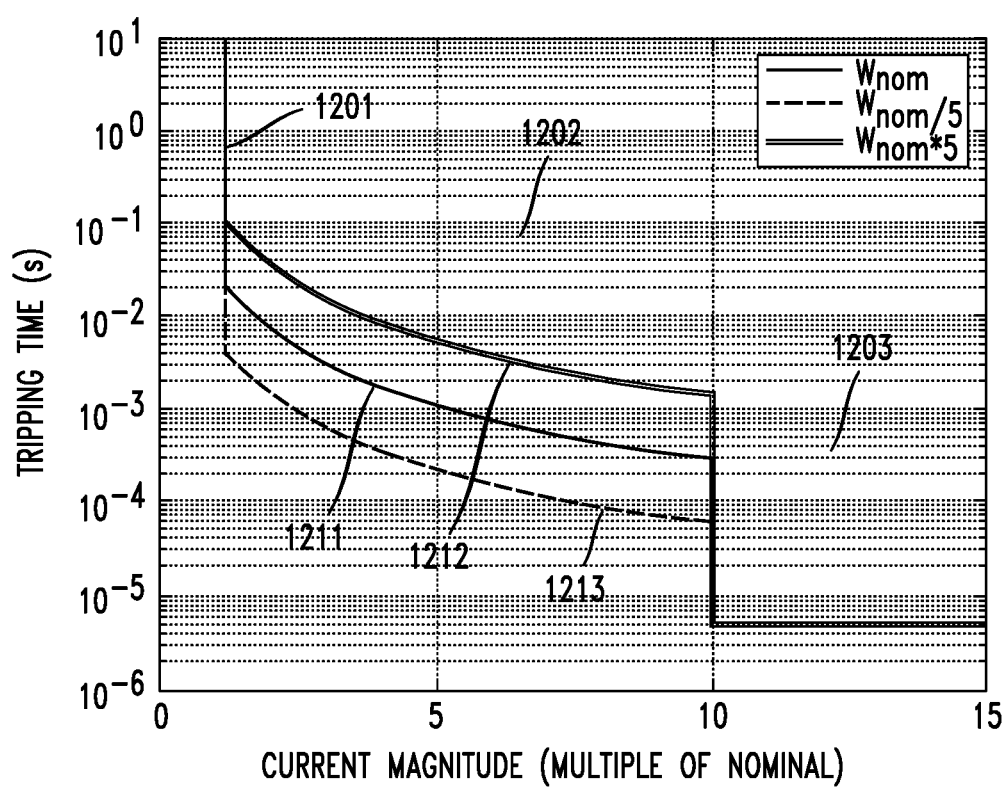
FIG. 12 shows a notional trip-time curve for a hypothetical circuit breaker. The x-axis represents circuit breaker current as a multiple of the rated current under a per-unit (pu) convention, and the y-axis represents the tripping time.

FIG. 12 shows a notional trip-time curve for a hypothetical circuit breaker. The x-axis represents circuit breaker current as a multiple of the rated current under a per-unit (pu) convention, and the y-axis represents the tripping time. The curve has three distinct regions.

On the far left, below a current of 1.2 pu, is region 1201. There, the value of trip time is undefined. That is, the circuit breaker will not trip for any current less than 1.2 pu.

On the far right, above currents of 10 pu, is region 1203. There, the trip time is equal to s. This indicates that any current above 10 pu will lead to an effectively instantaneous trip response. The value of 5 μs conservatively estimates the time between the measurement taking place and the circuit breaker reaching its fully open state.

Between 1.2 pu and 10 pu is region 1202. As seen in FIG. 12, region 1202 contains three curves 1211, 1212, and 1213, corresponding respectively to the predetermined energy thresholds labeled in the legend of FIG. 12 as $W_{nom}$, $W_{nom}/5$, and $W_{nom}*5$. When the circuit breaker current is within this region, the algorithm computes a value of energy by performing a time integral of the square of the current. The integrated energy value is continuously compared to the predetermined energy threshold value. If the predetermined energy threshold is exceeded, the circuit breaker opens. The predetermined threshold energies shown in FIG. 12 are purely illustrative and are set using a nominal energy $W_{nom}$, which corresponds to the rated circuit breaker current (in this example, 100 A) over a period of 1 second. In this example, the other two predetermined threshold energies are, respectively, 0.2 and 5 times $W_{nom}$.

Because the electrothermal energy is proportional to the square of the electric current, $W_{nom}$ can equivalently be expressed in terms of a nominal current $I_{nom}$, that is, $W_{nom} \propto I_{nom}^2$. When implementing the curve shown in FIG. 12 in the digital signal processor, the user can specify both the minimum and maximum edges of the I2t trip region, for example 1.2 pu and 10 pu as indicated in FIG. 12. The user can also specify the energy threshold used to define a trip time in that region.

The following describes an example triggering algorithm for implementation in a digital controller. Referring to Table 3, six parameters are defined that specify time durations involved in a circuit breaker-tri event.

TABLE 3

Time durations involved in a circuit breaker trip event

| Symbol | Definition | Comment |
|---|---|---|
| $\tau_S$ | Sensor latency | A fixed value determined by the sensor technology being used. |
| $\tau_{DSP}$ | Combined DSP sample, conversion, and computation time | A controller-driven value. $\tau_{DSP}$ determines the fastest possible trip response, hence it is preferably as small as possible. |
| $\tau_{TRIP}$ | Programmable trip time | A controller-driven value. $\tau_{TRIP}$ is set indirectly through trip-time curves that emulate conventional circuit breaker trip behavior but ultimately determines nuisance trip rejection capabilities, needs to be adjustable by application |
| $\tau_{SYNC}$ | Controlled delay between PCSS and forward-leg trigger signals | A controller-driven value. Because $\tau_{SYNC}$ determines the firing coordination between the JFET switch circuit 1000 and the PCSS 1005, it is desirable to set it with the highest possible precision. |
| $\tau_{FL}$ | Forward-leg response time | A fixed value determined by the JFET gate driver. |
| $\tau_{PCSS}$ | PCSS response time | A fixed value determined by the optical driver. |

As indicated in the table, $\tau_S$, $\tau_{FL}$, and $\tau_{PCSS}$ are fixed values determined by the hardware being used. The values $\tau_{DSP}$, $\tau_{TRIP}$, and $\tau_{SYNC}$ are controller-driven; that is, they are defined by programming the controller according to the desired operation of the circuit breaker. They may also be limited by the time needed for the hardware to perform its required operations.

The values $\tau_{TRIP}$, and $\tau_{SYNC}$ are programmable by the operator. It should also be noted that the setting for $\tau_{TRIP}$ controls the rejection of nuisance trips, and it can be adjusted to meet the requirements of particular applications.

More specifically $\tau_{TRIP}$ may be set indirectly through trip-time curves, as indicated in Table 3, above. The derivation of the trip-time curves can take into account factors such as the hardware stress limits as well as requirements of the specific application. Different system definitions and configurations will vary in parameters such as line inductance (at least for larger systems), fault impedance, fault current, capacitance and other associated component values, and hardware stress. The timing of the circuit breaker, which may depend in part on the trip-time curves as well as other factors, would typically be adjusted to keep the hardware stress below threshold values that might impact the reliability of the JFETs and other devices. Generally, these adjustments would seek an acceptable tradeoff between reducing stress to preserve hardware lifetimes, and reducing the frequency of nuisance trips on occurrence of transients rather than hard faults.

The determination of the sync time $\tau_{SYNC}$ will typically be guided by numerical simulations and numerical models, with the objective of keeping the hardware stress below thresholds that impact reliability. These could be thresholds on any of current, voltage, and temperature. Such simulations may, at times, be validated by experimental measurements.

By way of example, a prototype was implemented with a $\tau_{DSP}$ of 1.5 µs. In the prototype, the PCSS and JFET leg trigger signals are synchronized to a 100-MHz clock source, and TSYNC is set with a resolution of 10 ns.

Two additional programmable parameters are $I_{nom}$ and $W_{set}$. $I_{nom}$ is the nominal value of the circuit breaker current $I_{line}$ that defines the endpoints of regions 1201-1203. More specifically, the endpoints of region 1202 are set at $aI_{nom}$ and $bI_{nom}$, where, in the present example, the programmable parameters a and b are set to a=1.2 and b=10, i.e., the load current falls within the predetermined range of 1.2 $I_{nom}$ and 10 $I_{nom}$. $W_{set}$ is the programmable energy threshold for tripping the circuit breaker in delayed-trip region 1202.

The timing algorithm determines whether the circuit breaker current $I_{line}$ is in no-trip region 1201, delayed-trip region 1202, or instant-trip region 1203, and will set the trip time accordingly. The response in the no-trip region 1201 maintains normal operation, i.e., the circuit breaker remains in a no-trip state. The response in the delayed-trip region 1202 protects against persistent overcurrent conditions, while tolerating transient overcurrent events that may arise due to capacitive load switching, line charging, and the like. The circuit breaker is in a delayed-trip state corresponding to delayed-trip region 1202. The response in the instant-trip region 1203 provides rapid shut-down in the event of hard fault conditions, thereby placing the circuit breaker in an instant-trip state.

Table 4 provides the settings for example current ranges for the respective regions 1201-1203, together with trip times for the example ranges.

TABLE 4

Trip Regions and Trip Times

| Trip Region | Range | Trip Time |
|---|---|---|
| No Trip | $I_{line} < 1.2I_{nom}$ | $\tau_{TRIP} = \infty$ |
| Delayed Trip | $1.2I_{nom} < I_{line} < 10I_{nom}$ | $W_{set} = \int_0^{\tau_{TRIP}} [I_{line}^2(t) - 1.2I_{nom}^2]dt$ |
| Instant Trip | $I_{line} > 10I_{nom}$ | $\tau_{TRIP} = \tau_{DSP}$ |

Figure 13:
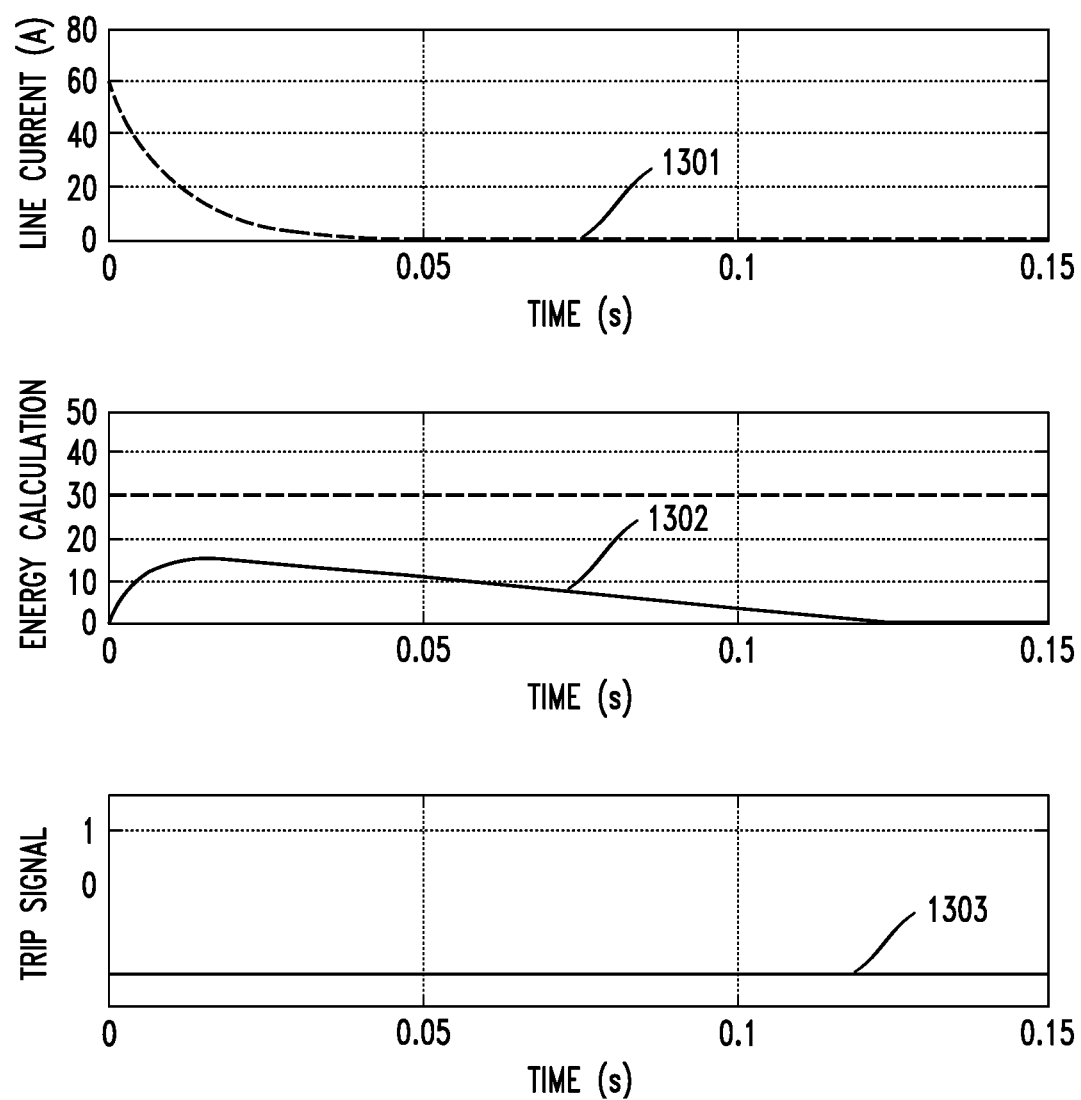
FIGS. 13 and 14 provide comparative examples of the response of a triggering control, as described herein, to a non-threatening overcurrent transient and to a hard fault, respectively.
Figure 14:
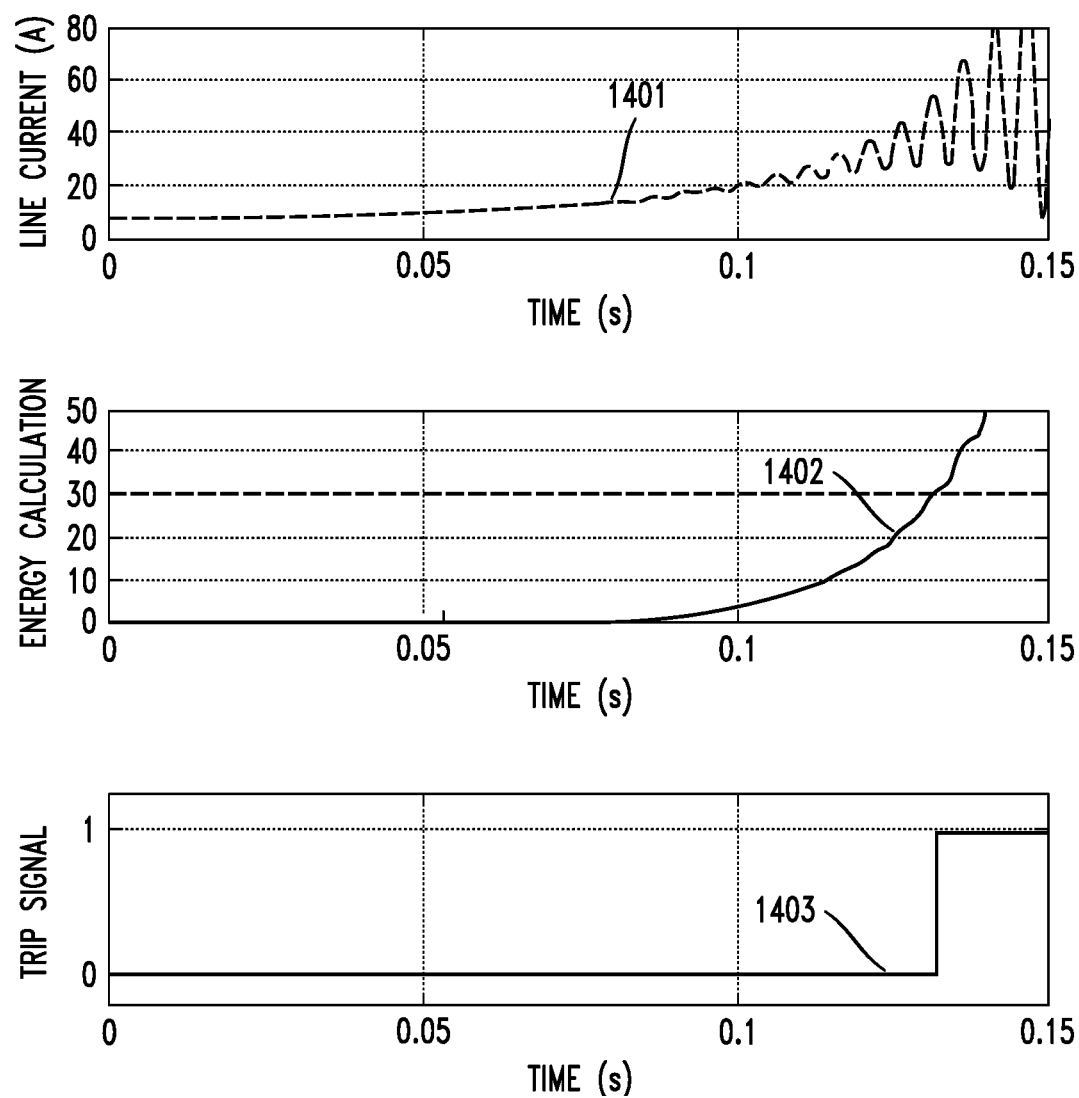

FIGS. 13 and 14 provide comparative examples of the response of the triggering control to, respectively, a non-threatening overcurrent transient and a hard fault. FIGS. 13 and 14 were generated by numerical modeling of an idealized circuit breaker system. In FIGS. 13 and 14, the line current, the calculated electrothermal energy, and the trip signal are plotted against a common timescale.

FIG. 13 represents an overcurrent transient caused by the inrush current of a downstream capacitive load. Trace 1301 shows the line current as decaying over time. Trace 1302 shows the energy calculation, which rises initially, but then decays. The energy threshold of 30 J for tripping the circuit breaker is indicated in trace 1302. It is evident on inspection that the calculated energy does not reach this threshold. Trip signal trace 1303 indicates that no trip takes place. In this scenario, the transient was permitted to subside without breaking current. This is the correct response. Breaking current in this case would constitute a nuisance trip.

FIG. 14 represents an instability in the line current driven by resonant behavior. This is a common concern in DC power systems, where it may be caused by constant power loads or mismatched load and source impedances. Trace 1401 shows line current oscillations growing rapidly after about 0.1 s. Trace 1402 shows the energy calculation, which rises steeply and crosses the energy threshold of 30 J at about 0.14 s. Trip signal trace 1403 indicates that a trip takes place very shortly after the threshold is crossed. According to the simulation, the digital controller tripped 67.3 ms after the line current first entered the delayed-trip region. Breaking the current was the correct response in this scenario.

In the circuit of FIG. 5, the PCSS (i.e., switch 110) shunts fault current around the JFET switch circuit 100. In an alternative circuit topology, the PCSS 110 shunts the fault current to ground. In the alternative topology, downline effects are decoupled from the response of the PCSS 110.

For example, analysis showed that in the baseline topology of FIG. 5, increasing the fault impedance tends to delay the onset of high-gain mode in the PCSS 110. More generally, the alternative topology can potentially offer more consistent energy dissipation through the PCSS, and more design freedom for the circuit components. However, our analysis also indicated that the new topology could add greater stress to the PCSS, but it would not offer substantially greater protection of the JFET switch circuit. Thus, the baseline topology may be more suitable for some applications, and the alternative topology may be more suitable for others.

Figure 15A:
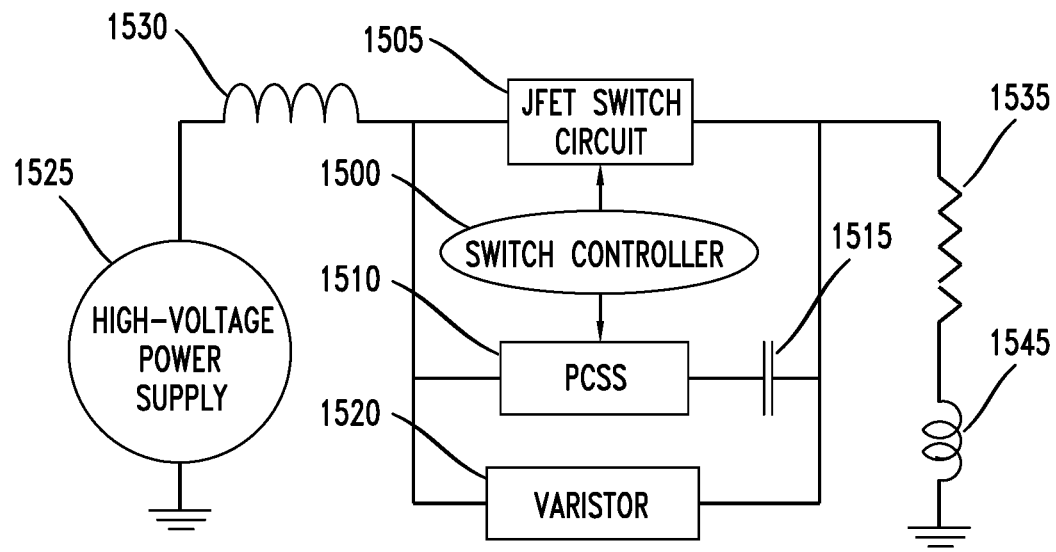
FIG. 15A is a simplified schematic diagram of a baseline circuit topology as described herein.

FIG. 15A is a simplified schematic diagram of the baseline circuit topology. It is a simplified version of FIG. 5, with several additional elements shown explicitly. As shown in FIG. 15A, all of the control elements are combined, for simplicity of presentation, into switch controller 1500, which controls the triggering of JFET switch circuit (elsewhere referred to as the JFET leg) 1505 and PCSS 1510. Current in the switchable bypass leg containing the PCSS 1510 charges a shunt capacitor 1515. A snubber element 1520, which is here shown as a varistor, is included for overvoltage protection. The circuit also includes a freewheeling diode 1540, which, for clarity, has been omitted from FIG. 15A but included in FIG. 15B. High-voltage power-supply 1525 is connected to the circuit by a line, whose impedance is represented in FIG. 15A by an inductor element 1530. The load is represented by a resistor element 1535 and a series inductor element 1545.

Figure 15B:
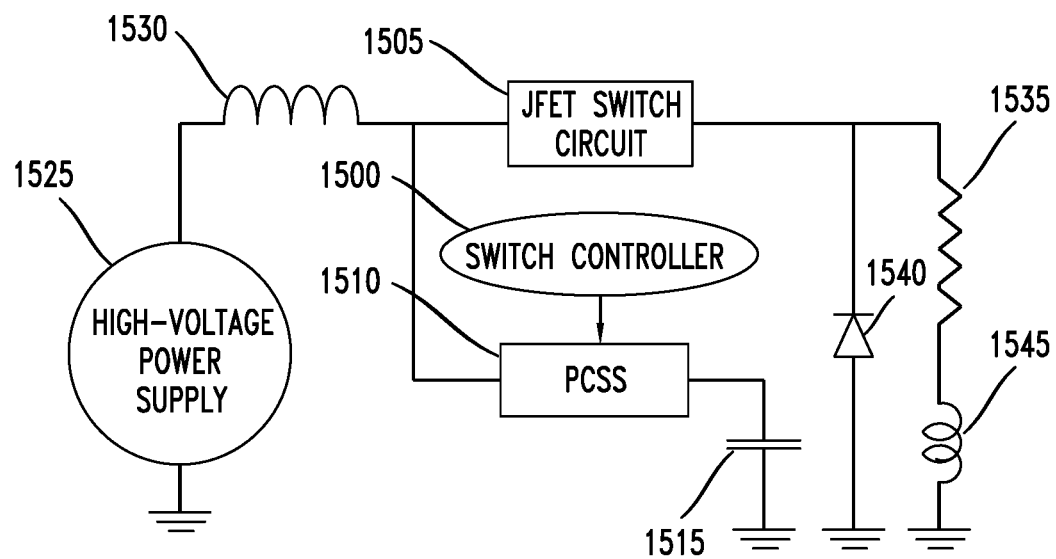
FIG. 15B is a simplified schematic diagram similar to FIG. 15A, but with modifications corresponding to an alternative circuit topology.

FIG. 15B is a simplified schematic diagram similar to FIG. 15A, but with modifications corresponding to the alternative topology. Elements that are common to FIGS. 15A and 15B are labeled with like reference numerals. The circuit also includes varistor 1520 as shown in FIG. 15A, but which, for clarity, has been omitted from FIG. 15B.

Comparison between FIGS. 15A and 15B will show that in FIG. 15B, the switchable bypass leg has been modified relative to FIG. 15A so that now, the current through the PCSS 1510 is shunted through the capacitor 1515 to ground.

As those skilled in the art will understand, the inductor element 1545 in series with the load 1535 will prevent the load current from changing instantaneously when the circuit breaker opens. Freewheeling diode 1540 is useful for suppressing the potentially large back emf that could otherwise occur when the circuit breaker opens. Varistor 1520 is useful for absorbing transient energy and clamping the voltage.

Thermal stress on the JFETs may be a limiting factor in a range of applications for the circuit breaker. An analytical and numerical modeling study determined, among other things, the maximum tolerable trip time for the JFET switch circuit that would keep the JFET temperature below 175° C. The model system had a 10 kV power source, and two parallel JFET stacks in the JFET switch circuit, each comprising eight JFETs connected in series. The JFET stack was duplicated in order to distribute the current, and thus to reduce the thermal stress on individual JFETs.

Figure 16:
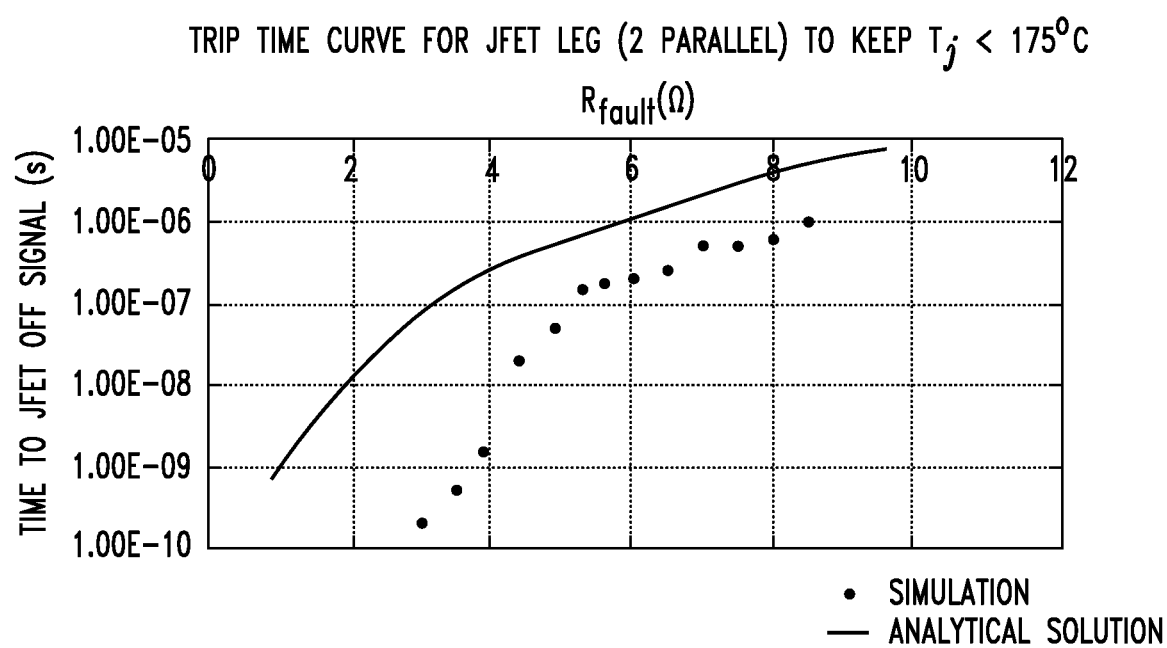
FIG. 16 is a graph of a JFET maximum trip time as a function of fault impedance, according to a numerical simulation of a model circuit. The plotted JFET trip time is the maximum trip time for which the JFET temperature remains below 175° C.

FIG. 16 is a graph showing some results of the modeling study. The modeled system is configured with a cable length of 1 km. In FIG. 16, a JFET maximum trip time is plotted as a function of the fault impedance. The plotted JFET trip time is the maximum trip time for which the JFET temperature remains below 175° C. The smooth curve in FIG. 16 is the result of an analytical solution, and the discrete data points are the result of a numerical simulation. The amount of electrothermal heating is also sensitive to the line impedance, which will depend on the system conductor length in which the circuit breaker is installed.

It can be inferred from FIG. 16 that in the model system, at a fault impedance of, e.g., about 6M, overheating of the JFETs can be avoided with a JFET trip time that is less than 1 µs according to our analytical solution, or less than 0.2 µs according to the simulation. Possible approaches for mitigating this heating problem include further increasing the number of parallel JFET stacks, and reducing the JFET trip time.

Another possible approach is to duplicate only a bottom portion of the JFET stack, i.e., a partial stack that contains fewer than all of the JFETs in the full stack. This approach can be effective even when only the bottom JFET is duplicated, because the electrothermal stress increases toward the bottom of the stack.

Figure 17:
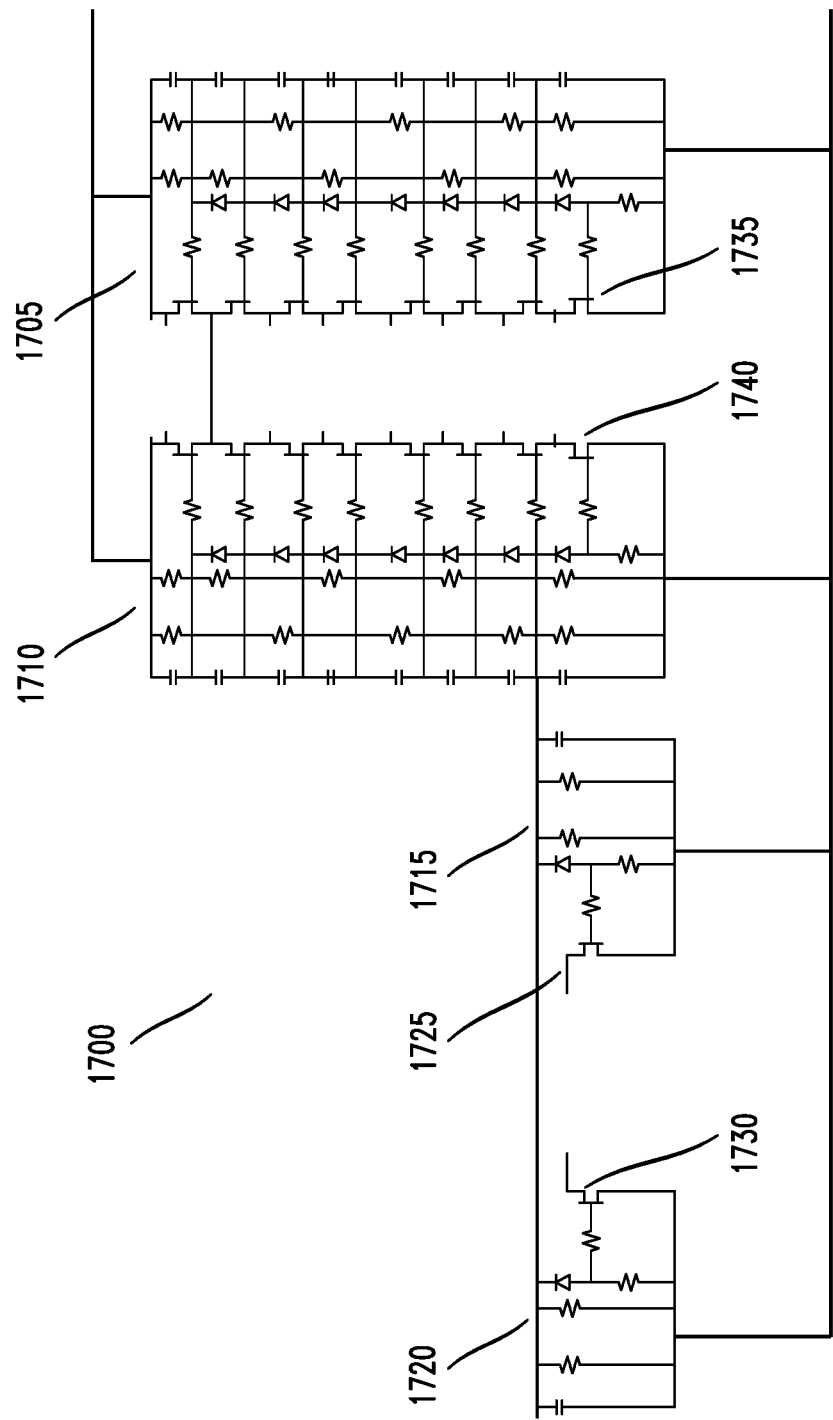
FIG. 17 is a partial schematic drawing of a circuit breaker in which there are two full JFET stacks in parallel with each other forming the JFET switch circuit, and in parallel with two bottom stages having one JFET each.

FIG. 17, for example, is a partial schematic drawing of a circuit breaker in which there are two full JFET stacks 1705, 1710 in parallel with each other forming the JFET switch circuit 1700, and in parallel with two bottom stages 1715, 1720 having one JFET each. As shown, JFET 1725 belongs to bottom stage 1715, and JFET 1730 belongs to bottom stage 1720. Although not explicitly shown in FIG. 17, one of bottom-stage JFETs 1725, 1730 is connected in parallel with the bottom JFET 1735 of JFET stack 1705, and the other of bottom-stage JFETs 1725, 1730 is connected in parallel with the bottom JFET 1740 of JFET stack 1710.

Although FIG. 17 shows bottom stages in which the partial JFET stacks only contain a single JFET, alternate embodiments could include bottom stages in which the number of series-connected JFETs is greater than one, but less than the number of JFETs in a full stack such as JFET stacks 1705 and 1710 of FIG. 17. Alternate embodiments would also be possible in which a bottom portion of each full stack is connected in parallel with two or more bottom stages having partial stacks of JFETs.

As explained above, the PCSS is triggered with an optical pulse. Optically triggered PCSS devices are known. Gallium nitride has attracted a great deal of interest as a diode composition for PCSS implementations. AlGaN is another composition of possible interest in this regard. Example PCSS implementations are described, for example, in the following publications, each of which is hereby incorporated herein in its entirety:

O. A. Ciniglio et al., "The application of photoconductive switches in HVDC circuit interruption," in IEEE Transactions on Power Delivery, vol. 5, no. 1, pp. 460-466, January 1990, doi: 10.1109/61.107313;

Andrew D. Koehler et al., "High Voltage GaN Lateral Photoconductive Semiconductor Switches," ECS Journal of Solid State Science and Technology, 6 (11) S3099-S3102 (2017);

G. M. Loubriel et al., "Photoconductive Semiconductor Switches: Laser Q-switch Trigger and Switch-Trigger Laser Integration," SAND97-3111, Sandia National Laboratories (1997);

U.S. Pat. No. 5,804,815, issued Sep. 8, 1998, under the title, "GaAs Photoconductive Semiconductor Switch" and commonly owned herewith; and United States Published Patent Application US2020/0382118A1, "Wide bandgap optical switch circuit breaker."

By way of example, trials were conducted using a lateral-geometry, gallium nitride (GaN) diode PCSS triggered by a 532-nm pulsed laser. Lock-on mode was successfully initiated in the GaN diode at trigger voltages in the range of 1.230 kV-1.463 kV with 2.5-mJ laser pulses, at a trigger voltage of 1.492 kV with a 2-mJ laser pulse, and at trigger voltages in the range of 1.777 kV-1.495 kV with 1-mJ laser pulses.

The trials mentioned above were performed on GaN diodes having a gap between top-surface electrodes of 600 µm. The results showed that dependable performance at trigger voltages substantially greater than 2 kV were not achievable. According to current belief, operation at higher voltages was limited because of premature electrical breakdown at the corners of the electrodes, where electric field lines tended to concentrate.

Several approaches are available for extending the voltage range. One approach is to shape the electrodes to reduce fringing fields. Another is to increase the gap between electrodes. For example, with larger gaps, we obtained encouraging results at voltages up to about 4.5 kV. Another approach is to operate two or more diodes in series, so that the electric field across an individual device is reduced. Alternatively, a single die can be implemented with two end electrodes and a floating middle terminal. Such a design is also expected to mitigate the problem of premature breakdown.

Another possible approach is to replace lateral-geometry devices, in which the electrodes share a common face of the die, with vertical-geometry devices, in which the electrodes are on respective, opposing faces. Vertical-geometry devices are expected to be able to sustain substantially higher electric fields without premature breakdown.

Figure 18:
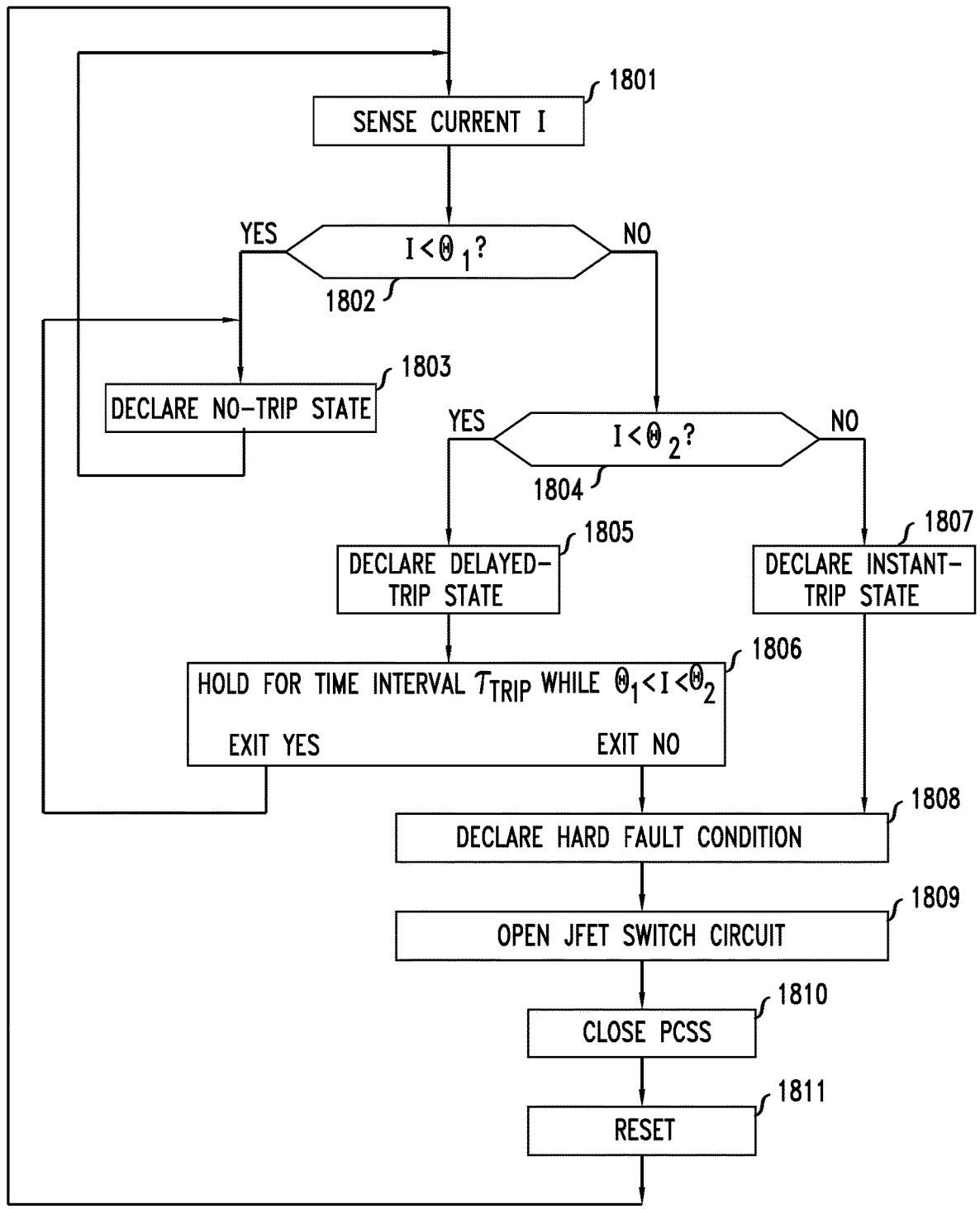
FIG. 18 is a flowchart of a method of operating a circuit breaker of the kind described here, in an example embodiment.

FIG. 18 is a flowchart of a method of operating a circuit breaker of the kind described here, in an example embodiment. It should be understood that the example of FIG. 18 is merely illustrative, and that it is subject to numerous variations.

Turning to FIG. 18, it will be seen that the current I is sensed at block 1801. A threshold test at block 1802 determines whether the current I is less than a no-trip threshold $\Theta_1$, such as the threshold 1.2 $I_{nom}$ discussed above in reference to Table 4. If the current I is less than the no-trip threshold, a no-trip state is declared, as indicated at block 1803. As indicated by a return arrow in FIG. 18, the sensing of the current I at block 1801 may then be continued.

If the current I is not less than the no-trip threshold, then, as indicated at block 1804, a second threshold test is performed to determine whether the current is less than an instant-trip threshold $\Theta_2$, such as the threshold 10 $I_{nom}$ discussed above in reference to Table 4. If the current I is less than the instant-trip threshold, a delayed-trip state is declared, as indicated at block 1805. While in the delayed-trip state, the circuit breaker remains closed for the time interval $\tau_{TRIP}$, as indicated at block 1806. To avoid nuisance trips, conditions may be defined for exiting the delayed-trip state and returning to a no-trip state before the full time interval $\tau_{TRIP}$ has elapsed, as indicated at block 1806 and by the return arrow from block 1806 to block 1803. Conditions for exiting the delayed-trip state are discussed below.

If an exit from the delayed-trip state has not occurred, then at the end of the time interval $\tau_{TRIP}$, a hard fault condition is declared, as indicated at block 1808, and the circuit breaker is opened by opening the JFET switch circuit (block 1809), and then closing the PCSS (block 1810). After the fault is repaired, the circuit breaker may be reset, as indicated at block 1811. Depending on the particular embodiment, the reset could be performed manually, or it could be performed automatically, using suitable sensing, and under a suitable control algorithm.

Returning to block 1804, if the current I is not less than the instant-trip threshold $\Theta_2$, an instant-trip state is declared, as indicated at block 1807. In that case, a hard fault condition is declared (block 1808), and the circuit breaker is opened by opening the JFET switch circuit (block 1809) and closing the PCSS (block 1810).

Numerous control algorithms could be devised for determining whether to exit the delayed-trip state represented in FIG. 18 by block 1806. Generally, exit criteria could involve threshold tests applied to current and/or to voltage, and they could also examine time histories of current and/or voltage while in the delayed-trip state. For at least some applications, it would be useful to use algorithms that have been tuned to the particular system in a manner that balances the objective of minimizing nuisance trigger events against the objective of minimizing potential system damage. Tuning of the control algorithms could be based, for example, on statistical data acquired from observations of real or simulated system performance.

EXAMPLE

Experimental testing of a circuit breaker configuration used a single stack of eight JFETs in the JFET stack in the JFET switch circuit. Upon activation of the test circuit, the load current was diverted out of the normally-ON JFET switch circuit and into the PCSS-based switchable bypass leg of the circuit. In that sense, the "PCSS current" and the "load current" are the same when the circuit is operated successfully. Typically, however, this current will decay to zero within a time on the order of one millisecond after the circuit is activated.

Trials were performed at 1.8 kV, with the turn-OFF transient initiated from a constant line current of 10 A. The load resistance was 180Ω. The PCSS was triggered with 1-2 mJ of laser energy at a wavelength of 532 nm.

Figure 19:
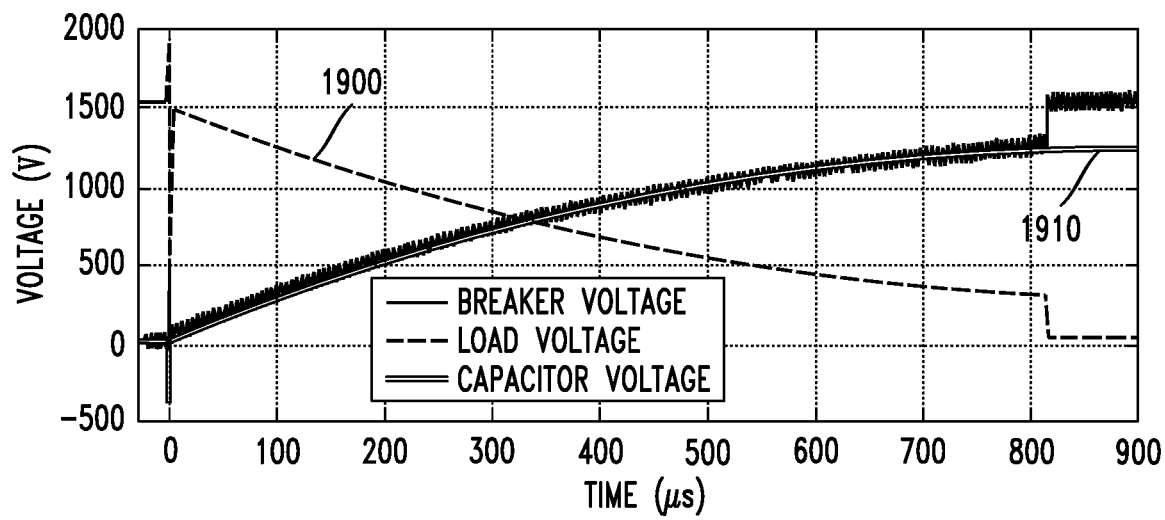
FIGS. 19 and 20 show transient responses in the operation of an experimentally tested prototype circuit breaker. Waveform dynamics over a roughly 1-ms timescale are shown in FIG. 19.
Figure 19:
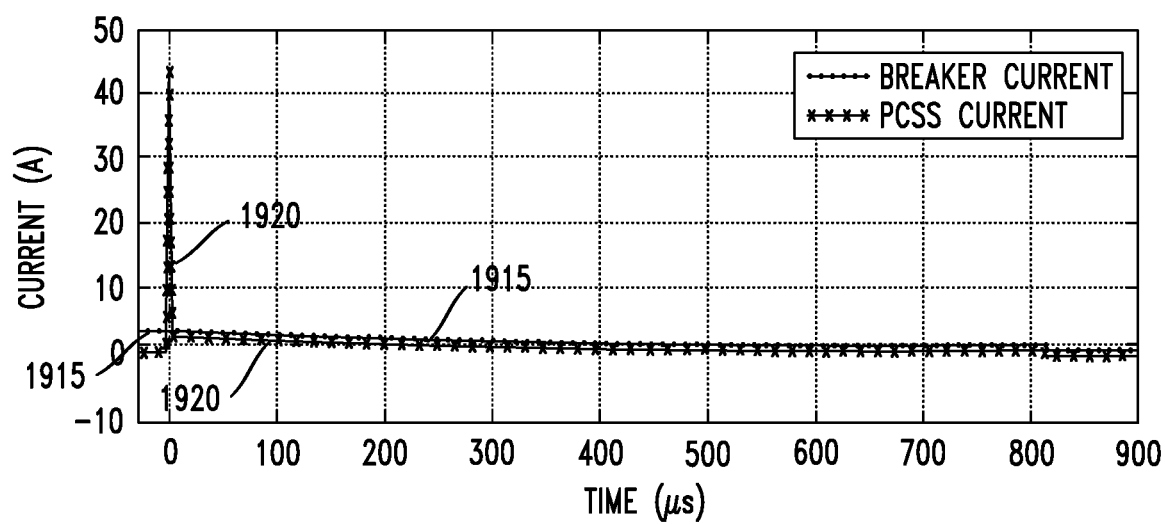
Figure 20:
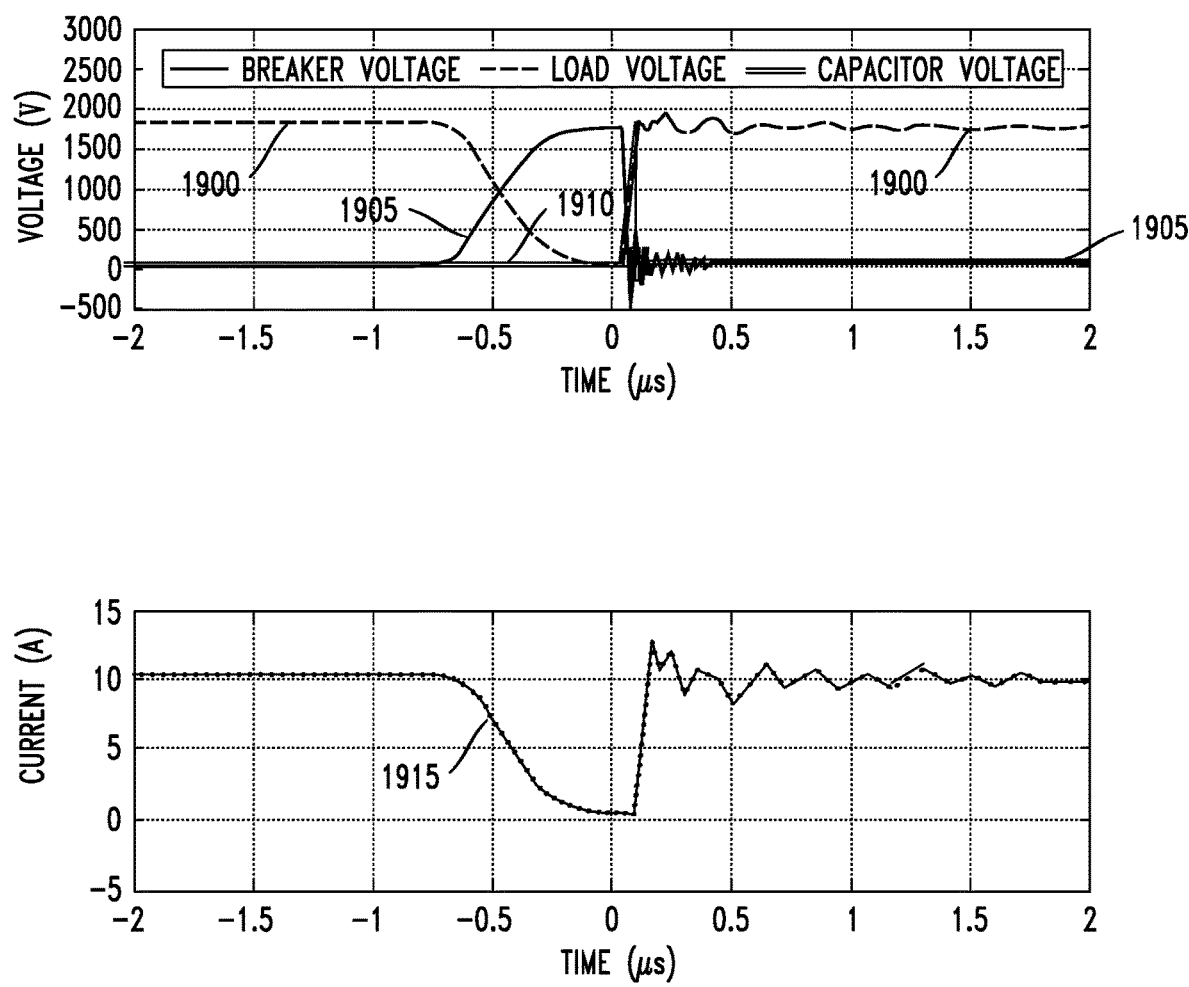

Test results for a successful turn-OFF transient are shown in FIGS. 19 and 20. Waveform dynamics during the full turn-OFF transient over a roughly 1-ms timescale are shown in FIG. 19. FIG. 20 shows the same transient response, in the same circuit, as FIG. 19, but on a shorter timescale of about 2 µs.

The voltage 1900 across the load, the voltage 1905 across the full breaker, and the voltage 1910 across the shunt capacitor were measured directly. The full line current 1915 (referred to in FIG. 19 as the "breaker current") was measured using a Hall-effect current probe. The PCSS current 1920 and the JFET circuit current (not shown explicitly in FIGS. 19 and 20) were determined indirectly by post-processing the directly measured quantities.

Waveform dynamics during the full turn-OFF transient over a roughly 1-ms timescale are shown for quantities 1900-1920 in FIG. 19. At this timescale, the turn-OFF duration is dominated by the charging time of the shunt capacitor (waveform 1910), which, at 1 µF, was conservatively oversized for the load current being interrupted.

On the timescale of FIG. 19, it is seen that the capacitor voltage 1910 increases to about 1.8 kV, as a result of which, at about t=815 µs, the PCSS goes below its high-gain threshold and turns OFF. It should be noted that this timing is very sensitive to the load resistance and the capacitor value that are present in the circuit.

FIG. 20 shows the same transient response, in the same circuit, as FIG. 19, but on a shorter timescale of about 2 µs. Only directly measured quantities are shown in FIG. 20. The respective waveforms in FIG. 20 are called out with the same reference numerals as their corresponding waveforms in FIG. 19.

FIG. 20 shows that the JFETs are initially ON, and the circuit breaker is in steady state, conducting about 10 A of current through the JFETs and load. At approximately t=−0.7 µs, the JFET switch circuit is turned OFF, the breaker voltage 1905 begins to rise on the circuit breaker (and also on the PCSS, although this is not visible in FIG. 20), the load voltage 1900 on the load declines, and current through the load declines, as shown by breaker current 1915. At t=0 µs, the PCSS is triggered into high-gain mode, and the voltage on the PCSS and the breaker voltage 1805 on the circuit breaker collapse back toward 0 V. Meanwhile, the breaker current 1915 increases back to 10 A after the initial capacitor charge transient.

For the experimental trials of FIGS. 19 and 20, control signals for the JFET gate driver and PCSS optical driver were produced in a multichannel signal generator. This allowed the critical delay between the JFET trigger time $t_1$ and the PCSS trigger time $t_2$ to be programmed directly, subject only to uncertainties in the end-to-end delay of the respective driver systems.

The JFET gate driver was based on an isolated driver IC intended for fast-switching applications. The propagation delay in this IC is low, on the order of tens of nanoseconds. However, the optical driver used for these experiments was a benchtop Nd:YAG laser system with end-to-end delay of tens of microseconds, with significant pulse-to-pulse variation.

Figure 21:
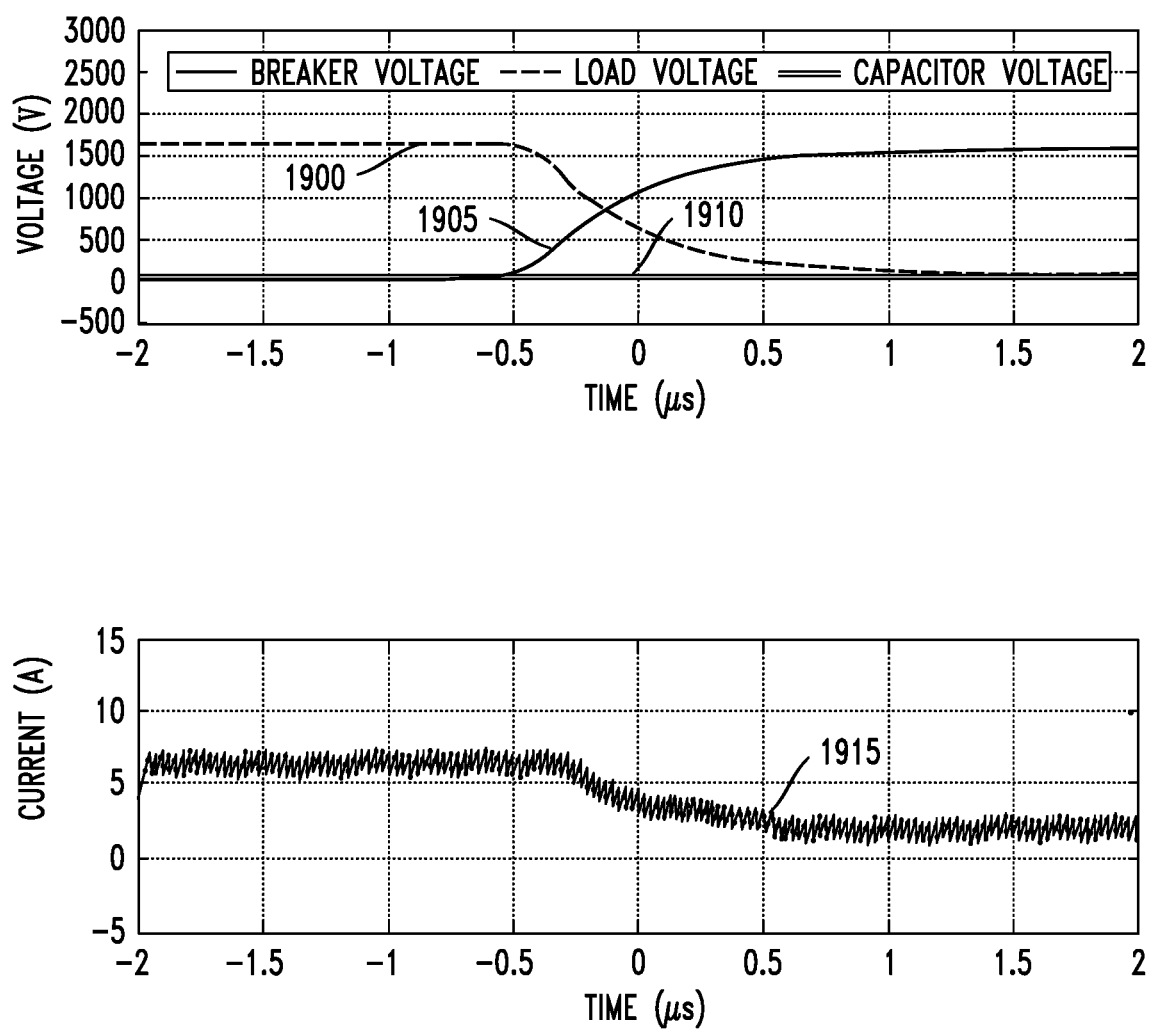

For purposes of comparison, FIG. 21 provides an example of a trial that failed because the PCSS fired too early and, as a consequence, did not achieve lock-on. FIG. 21 shows a result of an experimental trial conducted at 1.5 kV, with the turn-OFF transient initiated from a constant line current of 3 A. The transient response is shown on a timescale of about 2 µs. The respective waveforms shown in FIG. 21 are called out with the same reference numerals as their corresponding waveforms in FIG. 20. It will be evident from the shapes of the respective waveforms that no current was diverted from the normally-ON JFET path, and that as a consequence, most of the turn-OFF energy was dissipated in the JFETs. The contrast between FIG. 20 and FIG. 21 underscores the importance of precise control of the time delay between the JFET trigger and PCSS activation.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A switching apparatus having a power input terminal for electric power and a load terminal for connection to a load, comprising:
   a transistor switch circuit connected between the power input terminal and the load terminal; and
   a switchable bypass leg connected to the power input terminal and bypassing the transistor switch circuit, the switchable bypass leg including a series-connected photoconductive semiconductor switch (PCSS);
   wherein the switchable bypass leg is configured to be optically switchable by the PCSS;
   wherein the transistor switch circuit comprises:
      at least a first plurality of n series-connected transistors, each of said transistors having a respective source terminal, a respective drain terminal, and a respective gate terminal, wherein for n a positive integer at least 3, the first plurality of n series-connected transistors includes a first transistor herein denominated $J_1$, a last transistor herein denominated $J_n$, and at least one transistor herein denominated $J_i$, i having respective positive integer values between 1 and n;
      a terminal S connected to the $J_1$ source terminal;
      a terminal D connected to the $J_n$ drain terminal;
      a control terminal G connected to the $J_1$ gate terminal; and
      a dedicated voltage-balancing network connected between terminal S and terminal D; and
   wherein the dedicated voltage-balancing network includes a number, at least two, of parallel-connected resistive legs, each parallel-connected resistive leg includes two or more series-connected resistors, and for each transistor after $J_1$, the gate terminal connects to one of the parallel-connected resistive legs such that the parallel-connected resistive legs collectively constitute a voltage divider for dividing voltage across the n series-connected transistors.

2. The switching apparatus of claim 1, the transistor switch circuit further comprising at least one partial transistor stack, wherein:
   each said partial transistor stack comprises a number p of series-connected transistors that is at least 1 but less than n; and
   each said partial transistor stack is connected in parallel across the transistors $J_1$ to $J_p$ of a respective plurality of n series-connected transistors.

3. The switching apparatus of claim 1, wherein the switchable bypass leg includes a capacitor series-connected with the PCSS.

4. The switching apparatus of claim 1, wherein the switching apparatus further comprises:
   a load current sensor configured to measure a load current exiting the load terminal; and
   a controller, the controller being connected to the load current sensor and configured to receive, from the load current sensor, a signal $S(I_L)$ indicative of a load current, the controller configured to infer the presence of a hard fault condition from the signal $S(I_L)$ and to declare an instant-trip state in response thereto, and the controller being configured to, when in the instant-trip state, first open the transistor switch circuit and then close the switchable bypass leg to enable conduction of a bypass current in the switchable bypass leg when the hard fault condition is inferred.

5. The switching apparatus of claim 4, wherein:
   the apparatus is further configured to enter a no-trip state, a delayed-trip state, or an instant-trip state, depending on the signal $S(I_L)$;
   when the hard fault condition is inferred, the controller is configured to cause the apparatus to enter the instant-trip state; and
   the controller is further configured such that:
      opening of the transistor switch circuit is not permitted in the no-trip state;
      opening of the transistor switch circuit is permitted in the delayed-trip state only when the load current is within a predetermined range of currents; and
      opening of the transistor switch circuit occurs in the instant-trip state when the hard fault condition is inferred.

6. The switching apparatus of claim 5, wherein the controller is configured such that opening of the transistor switch circuit in the delayed-trip state occurs after a time interval in which a cumulative amount of electrothermal energy determined from the signal $S(I_L)$ reaches a predetermined energy threshold.

7. The switching apparatus of claim 4 further comprising an optical source, wherein:
   the controller is configured to close the switchable bypass leg by sending a trigger signal to turn ON the optical source, the optical source configured to switch closed the PCSS; and
   the controller is further configured to send the trigger signal at a specified time after the opening of the transistor switch circuit.

8. The switching apparatus of claim 4, wherein:
   the controller is configured to close the switchable bypass leg by sending a trigger signal to turn ON an optical source for switching closed the PCSS; and
   the controller is further configured to send the trigger signal at a specified time after the opening of the transistor switch circuit.

9. The switching apparatus of claim 8, wherein:
   the PCSS has a voltage threshold for a high-gain mode; and
   the specified time is a time when a voltage across the PCSS is above the voltage threshold for the high-gain mode.

10. The switching apparatus of claim 1, wherein the switchable bypass leg further includes a capacitor series-connected to the PCSS and to the load terminal.

11. The switching apparatus of claim 1, wherein the switchable bypass leg further includes a capacitor series-connected to the PCSS and to ground, the switchable bypass leg thereby bypassing the load terminal.

12. The switching apparatus of claim 1, wherein the at least a first plurality of n series-connected transistors is at least a first plurality of n series-connected JFETs.

13. A method, comprising, in a power circuit:
sensing an electric current I on an input path directed to a load terminal for connecting to a load;
detecting whether the sensed electric current I is in a fault condition;
opening a transistor switch circuit in response to a detection of a fault condition, resulting in breaking of the input path directed to the load terminal; and
then closing a photoconductive semiconductor switch (PCSS), resulting in diverting the electric current onto a switchable bypass path that bypasses the transistor switch circuit;
wherein:
the opening of the transistor switch circuit comprises turning OFF a normally-ON transistor switch circuit;
the transistor switch circuit comprises at least one cascaded series of three or more transistors, including a bottom transistor at a bottom end of the series and a top transistor at a top end of the series;
in each said cascaded series, a terminal S is connected to a source terminal of the bottom transistor, and a terminal D is connected to a drain terminal of the top transistor; and
for each said cascaded series, a dedicated voltage-balancing network comprising at least two parallel-connected resistive legs is connected between terminal S and terminal D as a voltage divider for dividing voltage across the cascaded series, each parallel-connected resistive leg comprising two or more series-connected resistors.

14. The method of claim 13, wherein:
the method further comprises declaring, in response to the sensing of the electric current I, one of a no-trip state, a delayed-trip state, or an instant-trip state;
the opening of the transistor switch circuit is not permitted from the no-trip state;
from the delayed-trip state, the opening of the transistor switch circuit is permitted only when the sensed electric current I is within a predetermined range of currents; and
the opening of the transistor switch circuit occurs upon declaring the instant-trip state.

15. The method of claim 14, wherein:
the method further comprises, when in the delayed-trip state, computing a cumulative amount of electrothermal energy in response to the sensing of the electric current I;
the method further comprises, when in the delayed-trip state, determining if the cumulative amount of electrothermal energy has reached a delayed-trip trigger threshold; and
the opening of the transistor switch circuit from the delayed-trip state occurs upon determination that the cumulative amount of electrothermal energy has reached the delayed-trip trigger threshold.

16. The method of claim 15, wherein the said states of the controller are responsive to a comparison of the sensed electric current I to a first current threshold $\Theta_1$ and to a second current threshold $\Theta_2$ greater than $\Theta_1$, such that for $I<\Theta_1$, the no-trip state is a stable state of the controller, for $i<I<\Theta_2$, the delayed-trip state is a stable state of the controller until the delayed-trip trigger threshold is reached, and for I at least $\Theta_2$, the instant-trip state is declared.

17. The method of claim 13, wherein:
the closing of the PCSS comprises sending a trigger signal to turn ON an optical source for switching closed the PCSS; and
the trigger signal is sent at a predetermined time after the opening of the transistor switch circuit.

18. The method of claim 17, wherein:
the PCSS has a voltage threshold for a lock-on mode of operation; and
the predetermined time for sending the trigger signal is a time when a voltage across the PCSS is above the voltage threshold for the lock-on mode.

19. The method of claim 13, wherein the switchable bypass path passes through a capacitor to the load terminal.

20. The method of claim 13, wherein the switchable bypass path passes through a capacitor to ground and bypasses the load terminal.

* * * * *